United States Patent
Kanno et al.

(10) Patent No.: US 6,198,349 B1
(45) Date of Patent: Mar. 6, 2001

(54) VARIABLE GAIN AMPLIFIER HAVING A MAXIMUM ATTENUATION-FACTOR LIMITING RESISTOR

(75) Inventors: Tohru Kanno; Osamu Inage, both of Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/263,218

(22) Filed: Mar. 5, 1999

(30) Foreign Application Priority Data

Mar. 9, 1998 (JP) .................................................. 10-056484

(51) Int. Cl.[7] ...................................................... H03G 3/12
(52) U.S. Cl. ............................................. 330/282; 330/284
(58) Field of Search .................................. 330/282, 284, 330/308; 250/214 AG

(56) References Cited

U.S. PATENT DOCUMENTS

| | | | |
|---|---|---|---|
| 5,408,113 | | 4/1995 | Kanno et al. .......................... 257/292 |
| 5,408,199 | * | 4/1995 | Nagano et al. ....................... 330/284 |
| 5,486,791 | * | 1/1996 | Spitalny et al. ..................... 330/282 |
| 5,523,721 | * | 6/1996 | Segawa et al. ...................... 330/282 |
| 5,668,501 | * | 9/1997 | Venes ................................... 330/282 |
| 5,805,019 | * | 9/1998 | Shin ..................................... 330/282 |
| 5,821,970 | * | 10/1998 | Sasaki et al. ....................... 347/116 |
| 6,051,826 | * | 4/2000 | Arimoto et al. .................. 250/208.1 |

\* cited by examiner

Primary Examiner—Robert Pascal
Assistant Examiner—Khanh Van Nguyen
(74) Attorney, Agent, or Firm—Oblon, Spivak, McClelland, Maier & Neustadt, P.C.

(57) ABSTRACT

A variable gain amplifier has a large variable range of a gain with respect to an analog signal having a level changing at a high-speed. The variable gain amplifier is provided with a digital-setting-type signal attenuator having a resistor string including a plurality of resistors connected in series. A maximum attenuation-factor limiting resistor is connected between the resistor string and a ground. Each of the analog switches is connected to respective points of the resistor string. A decoder generates a control signal for selecting at least one of the analog switches, the control signal being generated based on setting data provided from an external device. A voltage across the resistor string is divided by the resistors included in the resistor string, and the divided voltage is output to an amplifier from at least one of the analog switches selected by the control signal generated by the decoder.

12 Claims, 18 Drawing Sheets

GAIN=A*(DD+1)/$2^I$ (TIMES)
A:FIXED AMP GAIN (TIMES)
DD:SETTING DATA
I:NUMBER OF BITS OF SETTING DATA

GAIN=$2^I$/(DD+1) (TIMES)
DD:SETTING DATA
I:NUMBER OF BITS OF SETTING DATA

GAIN=A-(a*DD) (dB)
A:FIXED AMP GAIN (dB)
a:MINIMUM ATTENUATION FACTOR
DD:SETTING DATA
I:NUMBER OF BITS OF SETTING DATA

GAIN=a*DD (dB)
a:MINIMUM ATTENUATION FACTOR (dB)
DD:SETTING DATA
I:NUMBER OF BITS OF SETTING DATA

DIGITAL-SETTING SIGNAL ATTENUATOR

GAIN=A×(R×DD1/($2^I$-1)+Ra)/(R+Ra)  (TIMES)
A:FIXED AMP GAIN   (TIMES)
DD1:SETTING DATA
I:NUMBER OF BITS OF SETTING DATA DD1
R:TOTAL RESISTANCE OF STRING
  OF RESISTORS
Ra:MAXIMUM ATTENUATION FACTOR
   LIMITING RESISTOR

GAIN=$(RA \times DD1/2^l + RB + DD2/2^m)$
       / $(RA + RB \times DD2/2^m)$ (TIMES)
A:FIXED AMP GAIN (TIMES)
DD1:SETTING DATA
DD2:SETTING DATA
l:NUMBER OF BITS OF SETTING DATA DD1
m:NUMBER OF BITS OF SETTING DATA DD2
RA:TOTAL RESISTANCE OF RESISTOR STRING(A)
RB:TOTAL RESISTANCE OF RESISTOR STRING(B)

GAIN=A×(R×DD1/$2^I$+Ri)/ (R+Ri) (TIMES)
A:FIXED AMP GAIN (TIMES)
DD1:SETTING DATA FOR RESISTOR STRING
DD3:SETTING DATA FOR RESISTOR
  SWITCHING CIRCUIT
I:NUMBER OF BITS OF SETTING DATA DD1
n:NUMBER OF BITS OF SETTING DATA DD3
R:TOTAL RESISTANCE OF RESISTOR STRING
Ri:SELECTED RESISTOR OF
  RESISTOR SWITCHING CIRCUIT
i:1~$2^n$

FIG.18

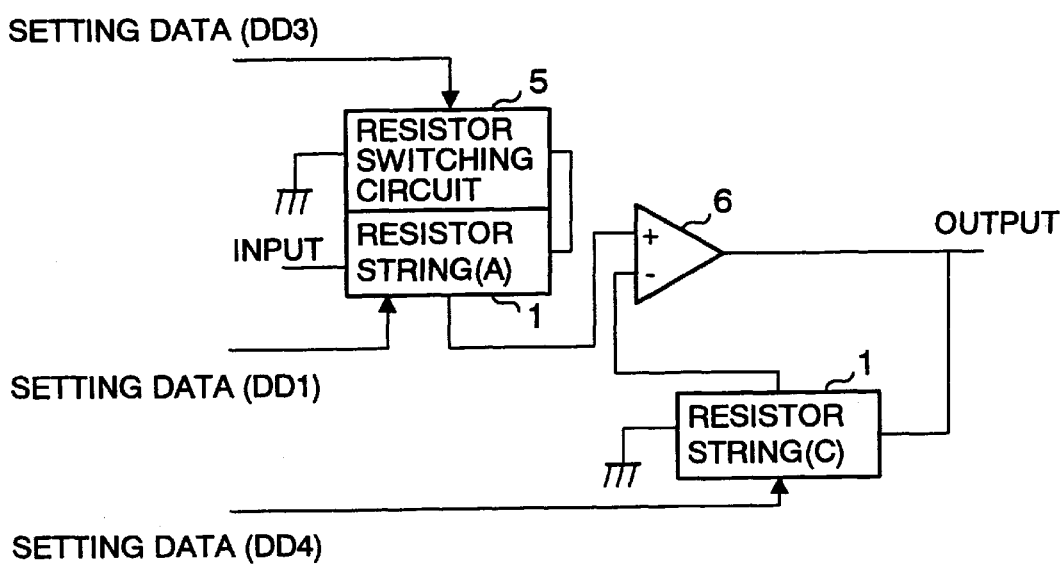

SETTING DATA (DD3)

SETTING DATA (DD1)

SETTING DATA (DD4)

GAIN=$(R \times DD1/2^I +Ri)/(R+Ri) \times 2^s/DD4$ (TIMES)
DD1: SETTING DATA FOR RESISTOR STRING(A)
DD3: SETTING DATA FOR RESISTOR
 SWITCHING CIRCUIT
DD4: SETTING DATA FOR RESISTOR STRING(C)
I: NUMBER OF BITS OF SETTING DATA DD1
n: NUMBER OF BITS OF SETTING DATA DD3
s: NUMBER OF BITS OF SETTING DATA DD4
R: TOTAL RESISTANCE OF RESISTOR STRING
Ri: SELECTED RESISTOR OF
 RESISTOR SWITCHING CIRCUIT
i: $1 \sim 2^n$

FIG.19

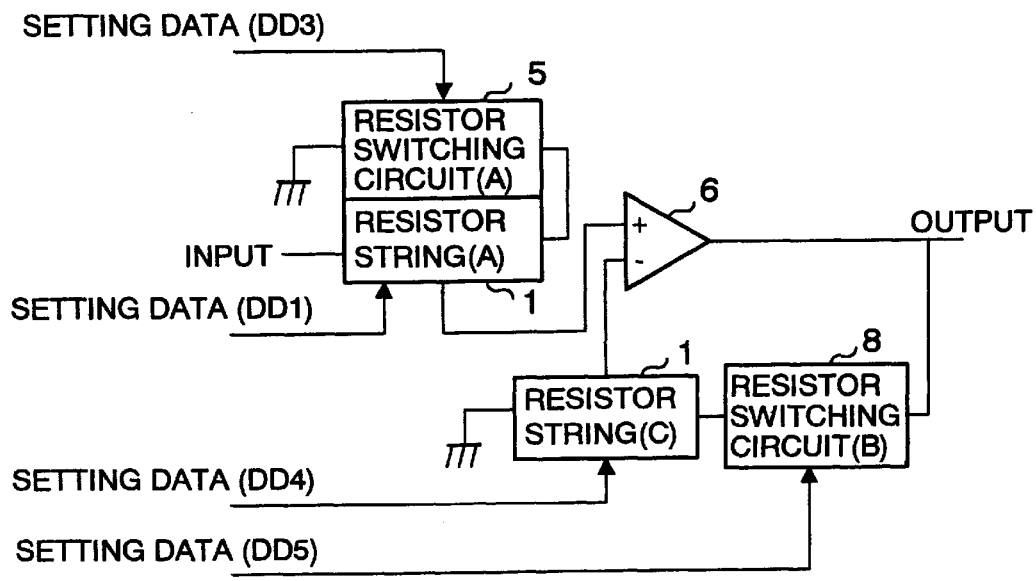

$GAIN = (RA + DD1/2^I + Ri) / (RA + Ri)$
  $\times ((RB + Rj)/Rj) \times 2^s/DD4$  (TIMES)

DD1: SETTING DATA FOR RESISTOR STRING(A)
DD3: SETTING DATA FOR RESISTOR
   SWITCHING CIRCUIT(A)
DD4: SETTING DATA FOR RESISTOR STRING(C)
DD5: SETTING DATA FOR
   RESISTOR SWITCHING CIRCUIT(B)
I: NUMBER OF BITS OF SETTING DATA DD1
n: NUMBER OF BITS OF SETTING DATA DD3
s: NUMBER OF BITS OF SETTING DATA DD4
p: NUMBER OF BITS OF SETTING DATA DD5
RA: TOTAL RESISTANCE OF RESISTOR STRING(A)
RB: TOTAL RESISTANCE OF RESISTOR STRING(B)
Ri: SELECTED RESISTOR OF
   RESISTOR SWITCHING CIRCUIT(A)
$i: 1 \sim 2^n$
Rj: SELECTED RESISTOR OF
   RESISTOR SWITCHING CIRCUIT(B)
$j: 1 \sim 2^n$

US 6,198,349 B1

VARIABLE GAIN AMPLIFIER HAVING A MAXIMUM ATTENUATION-FACTOR LIMITING RESISTOR

BACKGROUND OF THE INVENTION

1. Field of the Invention

The present invention generally relates to a variable gain amplifier and, more particularly, to a variable gain amplifier for adjusting a level of an analog image-signal component contained in a video signal supplied by, for example, a CCD linear image sensor so as to convert the image signal component which corresponds to an amount of an input light into digital data. Such a variable gain amplifier is used in a CCD analog-signal processing circuit which supplies an analog signal to an A/D converter converting an image signal into digital image data.

2. Description of the Related Art

FIG. 1 shows a first example of a conventional variable gain amplifier that comprises an amplifier 2 and an R-2R ladder 11 serving as a signal attenuator. FIG. 2 is a circuit diagram of the R-2R ladder 11. Additionally, FIG. 3 shows a second example of a conventional variable gain amplifier that comprises an operational amplifier 12 and the R-2R ladder 11 as a signal attenuator provided in a feedback loop of the operational amplifier 12.

FIG. 4 shows a third example of a conventional gain amplifier that comprises the amplifier 2 and a dB-attenuator 13. The dB-attenuator 13 may be a π-type or a T-type. FIG. 5 is a circuit diagram of the dB-amplifier 13 of a π-type. As shown in FIG. 5, the dB-amplifier 13 comprises a plurality of π-type amplifiers so that a necessary number of the π-type amplifiers through which a signal is passed are selected from among the plurality of π-type amplifiers. FIG. 6 shows a fourth example of a conventional variable gain amplifier that comprises the operational amplifier 12 and the dB-attenuator 13 provided in a feedback loop of the operational amplifier 12. Additionally, there is an amplifier as a fifth example of a conventional variable gain amplifier that comprises a voltage controlled variable gain amplifier and a D/A converter.

According to the above-mentioned first and second examples of the conventional variable gain amplifier, a variable range of a gain is very large and a number of variation steps is small. However, according to the second example, since a gain setting curve is inverse proportional to a setting data curve, a high-speed gain setting can be achieved by rendering an image signal after A/D conversion, that is, a peak value of image data to be the setting data.

According to the above-mentioned third and fourth examples of the conventional variable gain amplifier, a variable range of a gain and a number of variation steps can be freely set. Accordingly, a fine gain setting can be done with a minimum setting-data length, that is, a minimum number of bits. However, if the number of variation steps is increased and a width of each step is set to a small value, a resistance range of a resistor included in the attenuator 13 must be increased. That is, a high resistance is required for the resistor included in the attenuator 13. This causes a problem when the variable gain amplifier is formed in a monolithic IC.

According to the fifth example of the conventional variable gain amplifier, a variable range of a gain, a number of variation steps and a setting curve can be freely set. However, it is difficult to achieve high accuracy fundamentally. If an R-2R ladder having a high accuracy is connected to an amplifier or an operational amplifier, an accurate IC process is required. Additionally, in this case, an ON resistance of each analog switch for selecting resistors included in the R-2R ladder must be decreased, that is, the size of the element constituting each analog switch must be increased. Accordingly, it is difficult to achieve a variable gain amplifier having a high accuracy, or such an amplifier must be very expensive if it can be made.

SUMMARY OF THE INVENTION

It is a general object of the present invention to provide an improved and useful variable gain amplifier in which the above-mentioned problems are eliminated.

A more specific object of the present invention is to provide a variable gain amplifier, which has a large variable range of a gain with respect to an analog signal having a level changing at a high-speed.

Another object of the present invention is to provide a variable gain amplifier in which an reverse proportional setting curve can be set for a fine gain adjustment and a high-speed gain setting.

A further object of the present invention is to provide a variable gain amplifier which can set a gain setting curve according to a logarithmic proportion (dB proportion) can be easily formed in a monolithic IC.

In order to achieve the above-mentioned problems, there is provided according to the present invention a variable gain amplifier comprising:

an amplifier; and a digital-setting-type signal attenuator comprising:
  a resistor string including a plurality of resistors connected in series;
  a maximum attenuation-factor limiting resistor connected between the resistor string and a ground;
  a plurality of analog switches each of which is connected to respective points of the resistor string; and
  a decoder generating a control signal for selecting at least one of the analog switches, the control signal being generated based on setting data provided from an external device, wherein a voltage across the resistor string is divided by the resistors included in the resistor string, and the divided voltage is output to the amplifier from at least one of the analog switches selected by the control signal generated by the decoder.

According to the present invention, a voltage across the resistor string is limited by the total resistance of the resistor string and a resistance of the maximum attenuation-factor limiting resistor. if the number of resistors included in the resistor strings is $2^I$, and the number of resistors selected by the selection of the one of the analog signal is DD1 which is represented by the setting data, a voltage output from the selected one of the analog switches is B times a voltage input to the resistor string. The ratio B is represented as follows.

$$(Ra+R\times(2^I-DD1)/2^I)/(R+Ra)$$

where R is a total resistance of the resistor string, and Ra is a resistance of the maximum attenuation-factor limiting resistor.

If the setting data comprises 8 bits and I=8, and when Ra=R, the setting data represents a value from 0 to 255. Accordingly, the ratio B is equal to 1 when DD1=0, and the ratio B is equal to 257/512 when DD1=255. That is, the ratio B is set to a value ranging from 257/512 to 1 according to the value represented by the setting data. A variation in the ratio B when the value represented by the setting data is changed by a minimum value is equal to 1/512. That is, a step value of the ratio B is 1/512.

As mentioned above, the variable gain amplifier according to the present invention controls the maximum attenuation factor by the maximum attenuation-factor limiting resistor. Thereby, an unnecessary attenuation range can be eliminated, and also a fine step value can be achieved.

In the variable gain amplifier according to the present invention, the decoder may generate the control signal for selecting two adjacent ones of the analog switches so that a middle voltage between voltages output from the two selected analog switches is output from the digital-setting-type signal attenuator to the amplifier.

According to this invention, since a middle voltage between voltages of each pair of two adjacent analog switches can be obtained, the number of steps in the variation of the ratio B is twice the number of resistors included in the resistor string. Thus, a fine step value can be obtained without increasing the number of resistors included in the resistor string.

Additionally, the resistor string may include a compensation capacitance provided between an arbitrary point of the resistor string and an input point of the resistor string.

In this invention, since the compensation capacitor compensates for a limitation in a bandwidth due to a low-pass filter formed by a capacitance of each of the analog switches and a resistance of each of the resistors, a wide bandwidth can be achieved.

Additionally, in the variable gain amplifier according to the present invention, the analog switches may include a plurality of first stage analog switches connected to the resistor string and a plurality of second stage analog switches, the first stage analog switches being divided into a plurality of groups so that the first stage analog switches included in each of the groups are connected to the respective one of the second stage analog switches.

According to this invention, the number of analog switches which are in relation to the selection of the voltage output from the digital-setting-type signal attenuator is reduced. Thus, a capacitance of the analog switches which capacitance cause a limitation of the bandwidth can be reduced, and a wide bandwidth can be obtained.

Additionally, the analog switches may further include a plurality of n-th stage analog switches where n is an integer greater than 3 so that (n−1)th stage analog switches are divided into a plurality of groups and each of the (n−1)th stage analog switches included in each of the groups are connected to the respective one of the n-th stage analog switches.

Additionally, in the variable gain amplifier according to the present invention, the maximum attenuation-factor limiting resistor may comprise a resistor switching circuit including a plurality of resistors so that one of the resistors of the resistor switching circuit is connected to the resistor string.

Further, the variable gain amplifier according to the present invention may further comprise a second digital-setting-type signal attenuator having an output connected to an output of the amplifier, the second digital-setting type signal attenuator having substantially the same structure as that of the digital-setting-type signal attenuator, wherein the amplifier comprises an operational amplifier having a normal input terminal and a reverse input terminal so that an output of the resistor string being input to the normal input terminal and an output of the second resistor string is input to the reverse input terminal.

Additionally, the variable gain amplifier may further comprise a second resistor switching circuit provided between the output of the operational amplifier and the output of the second digital-setting-type signal attenuator, the second resistor switching circuit having substantially the same structure as the resistor switching circuit.

Additionally, the variable gain amplifier according to the present invention may further comprise a second decoder for decoding setting data provided from an external device so as to generate the setting data provided to the digital-setting-type signal attenuator.

Further, the variable gain amplifier may further comprise a selector selecting one of the setting data to be provided to the second decoder and the setting data to be provided to the digital-setting-type signal attenuator so that the selected setting data is provided to the digital-setting-type signal attenuator.

The variable gain amplifier according to the present invention may be applied to an image scanner for scanning an original image and outputting image data. Additionally, the image scanner provided with the variable gain amplifier according to the present invention may be used in a copy machine.

Other objects, features and advantages of the present invention will become more apparent from the following detailed description when read in conjunction with the accompanying drawings.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 18 is a block diagram of a variable gain amplifier according to a tenth embodiment of the present invention;

FIG. 19 is a block diagram of a variable gain amplifier according to an eleventh embodiment of the present invention;

DETAILED DESCRIPTION OF THE PREFERRED EMBODIMENTS

Figure 1:
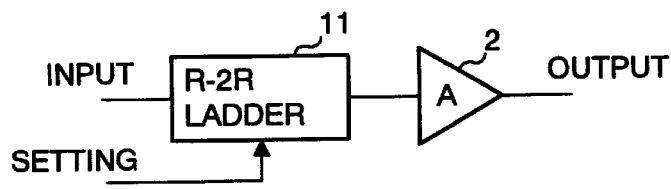
FIG. 1 is a block diagram of a first example of a conventional variable gain amplifier.
Figure 2:
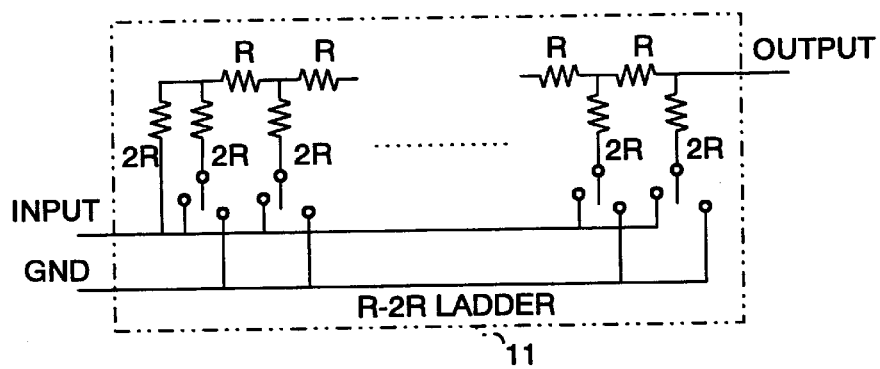
FIG. 2 is a circuit diagram of an R-2R ladder shown in FIG. 1.
Figure 3:
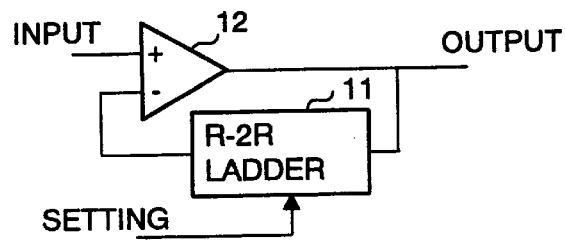
FIG. 3 is a block diagram of a second example of a conventional variable gain amplifier.
Figure 4:
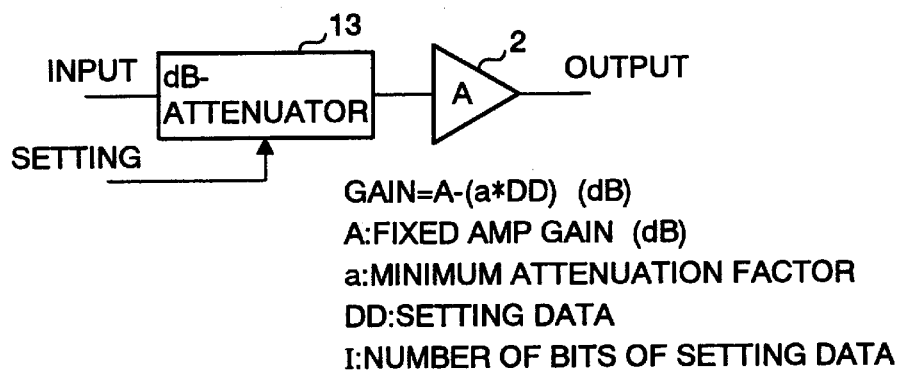
FIG. 4 is a block diagram of a third example of a conventional variable gain amplifier.
Figure 5:
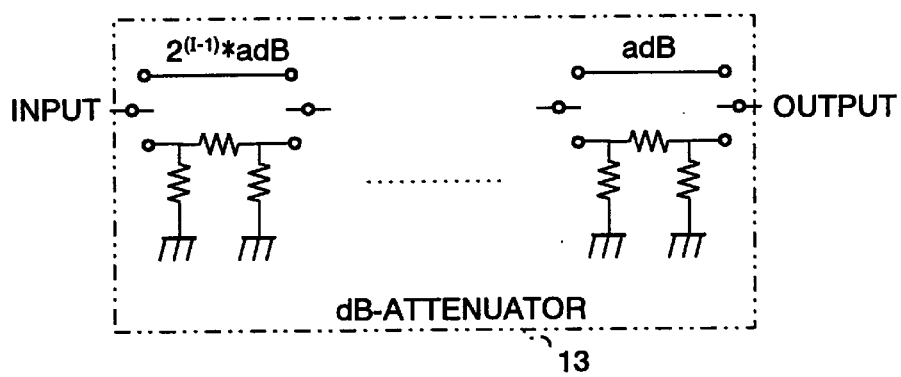
FIG. 5 is a circuit diagram of a dB-amplifier shown in FIG. 4.
Figure 6:
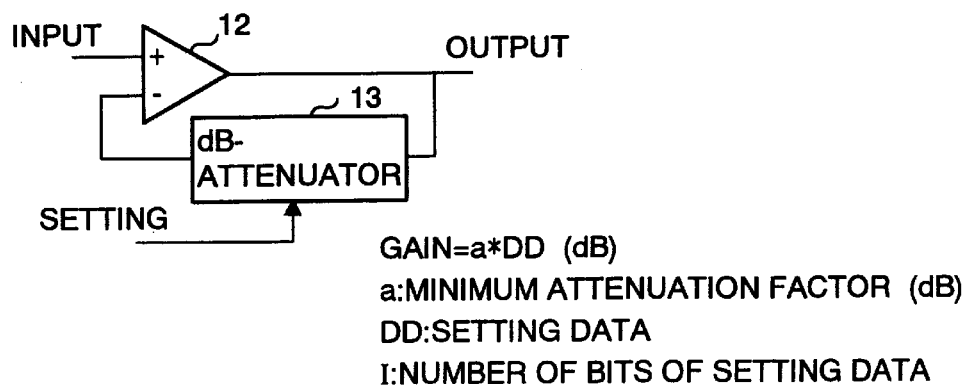
FIG. 6 is a block diagram of a fourth example of a conventional variable gain amplifier.
Figure 7:
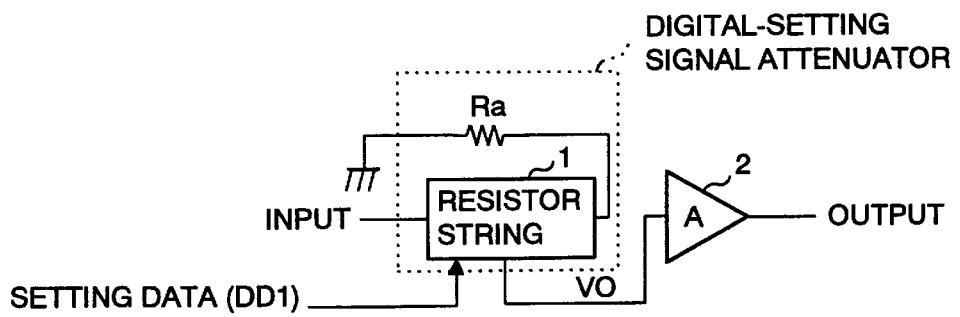
FIG. 7 is a block diagram of a variable gain amplifier according to a first embodiment of the present invention.

A description will now be given, with reference to FIGS. 7 and 8, of a first embodiment of the present invention. FIG. 7 is a block diagram of a variable gain amplifier according to the first embodiment of the present invention.

As shown in FIG. 7, the variable gain amplifier according to the first embodiment of the present invention comprises a resistor string 1, an amplifier 2 and a maximum attenuation-factor limiting resistor Ra. The resistor string 1 and the maximum attenuation-factor limiting resistor Ra together constitute a digital-setting signal attenuator. An analog image signal which is an output voltage signal of a CCD image sensor (not shown in the figure) is provided to an input terminal of the resistor string 1. Additionally, setting data DD1 is provided to the resistor string 1 from an external device. The resistor string 1 produces an output voltage V0 in accordance with the analog image signal and the setting data DD1, and outputs the output voltage signal V0 to the amplifier 2.

Figure 8:
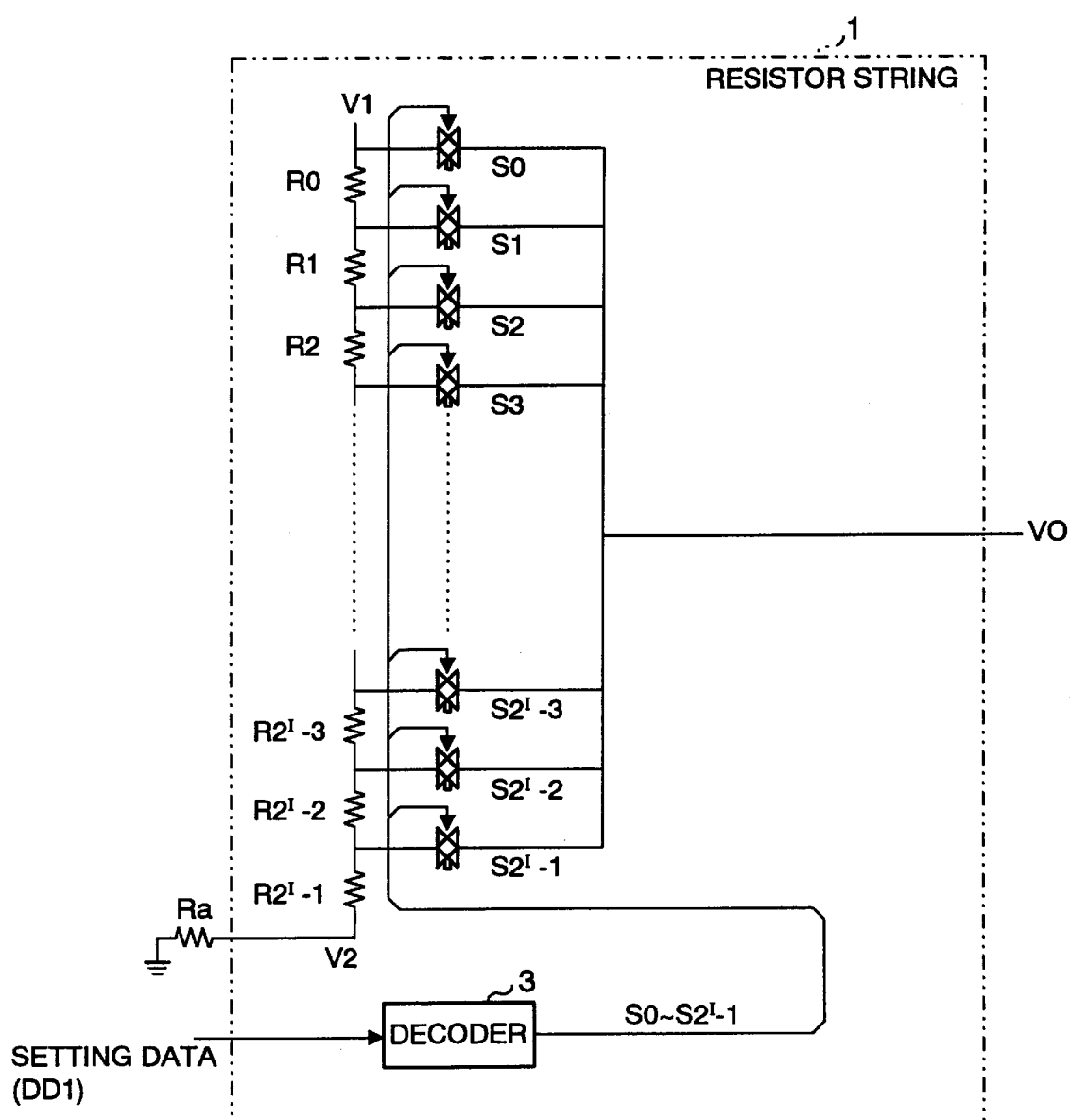
FIG. 8 is a circuit diagram of a resistor string assembly shown in FIG. 7.

FIG. 8 is a circuit diagram of the resistor string 1 shown in FIG. 7. The resistor string 1 comprises a plurality of resistors R0 to R($2^I$-1) which are connected in series, a plurality of analog switches S0 to S($2^I$-1) and a decoder 3. The setting data DD1 is provided to the decoder 3 so that the decoder 3 decodes the setting data DD1 and provides an ON/OFF signal to each of the analog switches S0 to S($2^I$-1) according to a result of the decoding. According to the ON/OFF signal output from the decoder 3, one of the analog switches S0 to S($2^I$-1) is selected to be turned on.

It is assumed that a voltage V1 (input voltage) is applied to an end (the side of the resistor R0) of the resistor string 1 and a voltage V2 appears at the opposite end (the side of the resistor R($2^I$-1) of the resistor string 1. In this case, if one of the analog switches S0 to S($2^I$-1) is turned on, the output voltage V0 is represented by the following equation, where DD1 in the equation is a value of the setting data DD1:

$$V0=[V1\times(2^I-DD1)\times r+V2\times DD1\times r]/(2^I\times r)$$

$$=V1\times(1-DD1/2^I)+V2\times DD1/2^I.$$

The following Table 1 shows a relationship between each value of the setting data DD1 and a state of each of the analog switches S0 to S$2^I$-1.

TABLE 1

| DD1 | S0 | S1 | S2 | S3 | ... | S$2^I$-3 | S$2^I$-2 | S$2^I$-1 |
|---|---|---|---|---|---|---|---|---|
| 0 | ON | OFF | OFF | OFF | ... | OFF | OFF | OFF |
| 1 | OFF | ON | OFF | OFF | ... | OFF | OFF | OFF |
| 2 | OFF | OFF | ON | OFF | ... | OFF | OFF | OFF |
| 3 | OFF | OFF | OFF | ON | ... | OFF | OFF | OFF |
| . | . | . | . | . | ... | . | . | . |
| . | . | . | . | . | ... | . | . | . |
| . | . | . | . | . | ... | . | . | . |
| $2^I$-3 | OFF | OFF | OFF | OFF | ... | ON | OFF | OFF |
| $2^I$-2 | OFF | OFF | OFF | OFF | ... | OFF | ON | OFF |
| $2^I$-1 | OFF | OFF | OFF | OFF | ... | OFF | OFF | ON |

When the conventional R-2R ladder is used, the attenuation factor may be reversed with respect to the setting, that is, monotony cannot be achieved if the R-2R ladder is not accurate. However, when the string of resistors R0, R1, R2 ... are used, a constant increase or decrease (monotony) in attenuation can always be achieved.

In the conventional circuit in which attenuation is achieved by only the R-2R ladder, an input of the amplifier which is a fixed gain (A times) is represented as follows:

$$DD1/(2^I-1).$$

If the setting data comprises 8 bits, the value represented by the setting data DD1 is 0 to 255. If the fixed gain is 0 to 1, the step is 1/255.

On the other hand, in the present embodiment, since the voltage applied across opposite ends of the string of the resistors R0 to R($2^I$-1) is limited by a total resistance R of the string of the resistors R0 to R($2^I$-1) and a resistance Ra of the maximum attenuation-factor limiting resistor Ra, the output voltage V0 output from the resistor string 1 is limited to B times the input voltage V1, where X1 is represented by the following equation:

$$X1=(Ra+R\times(2^I-DD1)/2^I)/(R+Ra).$$

In the above-mentioned equation, $2^I$ represents a number of resistors included in the string of resistors R0 to R($2^I$-1), and DD1 is a value represented by the setting data DD1.

If the setting data comprises 8 bits and I=8, and when Ra=R, the setting data represents a value from 0 to 255. Accordingly, the ratio represented by the above-mentioned equation is 1 when DD1=0, and 257/512 when DD1=255. That is, the ratio is set to a value ranging from 257/512 to 1 according to the value represented by the setting data DD1. A variation of the value in the above-mentioned equation which variation corresponds to a minimum value of variation in the value represented by the setting data DD1 is 1/512. That is, a step value is 1/512.

As mentioned above, the variable gain amplifier according to the present embodiment controls the maximum attenuation factor by the maximum attenuation-factor limiting resistor Ra. Thereby, an unnecessary attenuation range can be eliminated, and also a fine step value can be achieved.

Figure 9:
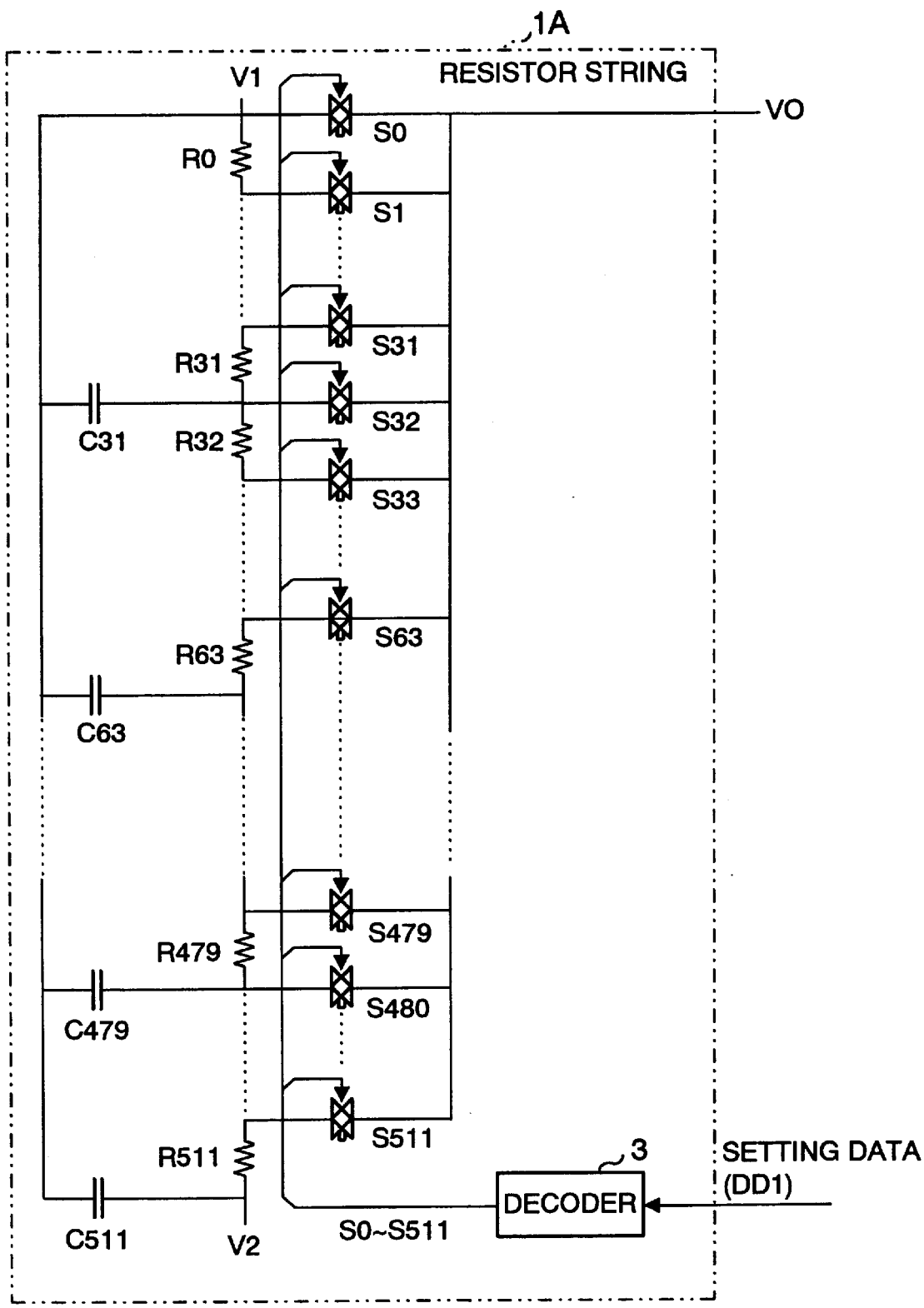
FIG. 9 is a circuit diagram of a resistor string provided in a variable gain amplifier according to a second embodiment of the present invention.

A description will now be given, with reference to FIG. 9, of a second embodiment of the present invention. FIG. 9 is a circuit diagram of a resistor string provided in a variable gain amplifier 1A according to the second embodiment of the present invention.

The resistor string 1A shown in FIG. 9 comprises 512 resistors R0 to R511 which are connected in series, 512 analog switches S0 to S511 and the decoder 3 which is the same as that of the first embodiment. The resistor string 1A further comprises 16 capacitors C31, C63, . . . , C479 and C511 which are connected to the string of the resistors as shown in FIG. 9.

Similar to the above-mentioned first embodiment, the output voltage V0 output from the resistor string 1A is limited to X2 times the input voltage V1, where X2 is represented by the following equation:

$$X2=(Ra+R\times(512-DD1)/512)/(R+Ra).$$

Accordingly, similar to the first embodiment, the variable gain amplifier according to the second embodiment of the present invention can arbitrarily set a width of a variation, and can achieve a fine step.

In the resistor string 1A, each of the analog switches S0 to S511 has a small capacitance. Accordingly, when such a capacitance is combined with the resistance of the resistors R0 to R511, a low-pass filter is formed which provides a limitation in a bandwidth. However, in the present embodiment, the capacitors C31, C63, . . . , C479 and C511 are provided so as to compensate for the capacitance of each of the analog switches S0 to S511. Thus, the bandwidth is not limited, and a wide bandwidth can be achieved.

Figure 10:
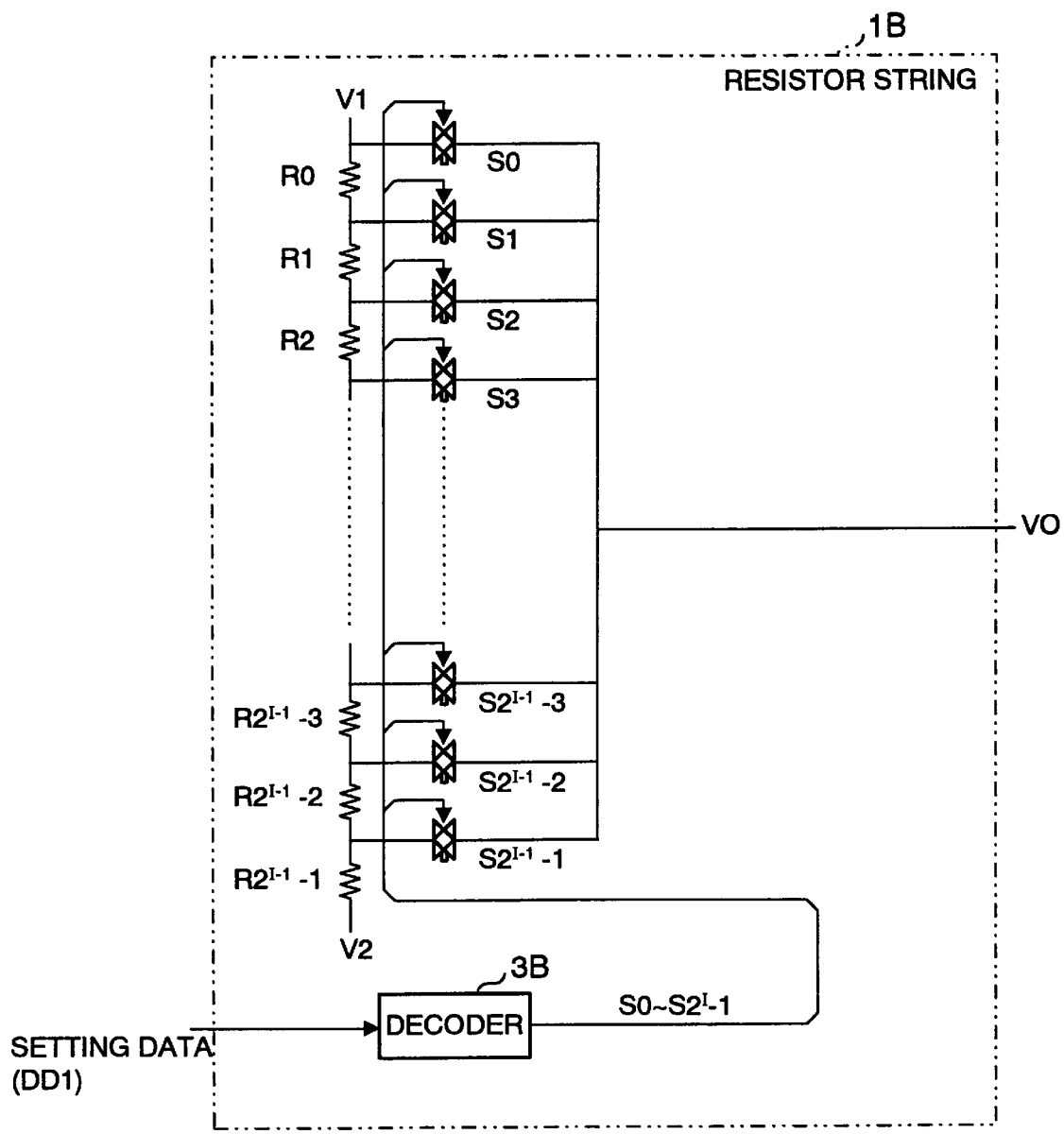
FIG. 10 is a circuit diagram of a resistor string provided in a variable gain amplifier according to a third embodiment of the present invention.

A description will now be given, with reference to FIG. 10, of a third embodiment of the present invention. FIG. 10 is a circuit diagram of a resistor string 1B provided in a variable gain amplifier according to the third embodiment of the present invention. In this embodiment, attenuation changing by $2^I$ steps is achieved by using $2^{I-1}$ resistors. In other words, the number of steps in attenuation is twice the number of resistors included in the string of resistors. This is achieved by generating a middle voltage between adjacent voltages which is generated by using an ON resistance of each of the analog switches S0 to $S2^{I-1}$. For example, a middle voltage between a voltage selected by the analog switch S2 and a voltage selected by the analog switch S3 is output by simultaneously turning on both the analog switch S2 and the analog switch S3 so as to divide the voltage across the resistor R2. The selection of the analog switches to be turned on is performed by a signal output from a decoder 3B. The following Table 2 shows a relationship between each value of the setting data DD1 and a state of each of the analog switches S0 to $S(2^I-1)$.

TABLE 2

| DD1 | S0 | S1 | S2 | S3 | ... | $S2^{I-1}$-3 | $S2^{I-1}$-2 | $S2^{I-1}$-1 |
|---|---|---|---|---|---|---|---|---|
| 0 | ON | OFF | OFF | OFF | ... | OFF | OFF | OFF |
| 1 | ON | ON | OFF | OFF | ... | OFF | OFF | OFF |
| 2 | OFF | ON | OFF | OFF | ... | OFF | OFF | OFF |
| 3 | OFF | ON | ON | OFF | ... | OFF | OFF | OFF |
| 4 | OFF | OFF | ON | OFF | ... | OFF | OFF | OFF |
| 5 | OFF | OFF | ON | ON | ... | OFF | OFF | OFF |
| 6 | OFF | OFF | OFF | ON | ... | OFF | OFF | OFF |
| 7 | OFF | OFF | OFF | ON | ... | OFF | OFF | OFF |
| . | . | . | . | . | ... | . | . | . |

TABLE 2-continued

| DD1 | S0 | S1 | S2 | S3 | ... | $S2^{I-1}$-3 | $S2^{I-1}$-2 | $S2^{I-1}$-1 |
|---|---|---|---|---|---|---|---|---|
| . | . | . | . | . | ... | . | . | . |
| $2^I$-5 | OFF | OFF | OFF | OFF | ... | ON | OFF | OFF |
| $2^I$-4 | OFF | OFF | OFF | OFF | ... | ON | OFF | OFF |
| $2^I$-3 | OFF | OFF | OFF | OFF | ... | ON | ON | OFF |
| $2^I$-2 | OFF | OFF | OFF | OFF | ... | OFF | ON | OFF |
| $2^I$-1 | OFF | OFF | OFF | OFF | ... | OFF | ON | ON |

Accordingly, the output voltage of the resistor string 1B can be represented by the following equation:

$$V0 \approx [V1 \times (2^I - DD1) \times r + V2 \times DD1 \times r]/(2^I \times r)$$

$$= V1 \times (1 - DD1/2^I) + V2 \times DD1/2^I$$

(condition: r<<ron).

DD1: a value represented by the setting data DD1.

I: a number of bits of the setting data DD1.

r: a resistance of each of the resistors R0 to $R^{I-1}$.

ron: an ON resistance of each of the switches S0 to $S^{I-1}$.

This relationship is similar to the relationship of the above-mentioned first embodiment. Accordingly, in the present embodiment, the number of resistors can be one half of the number of resistors provided in the first embodiment and also the number of analog switches can be one half of the number of analog switches provided in the first embodiment. Thereby, a bandwidth defined by the resistance of the string of resistors R0 to $R2^{I-1}$ and the capacitance of the analog switches S0 to $S2^{I-1}$ can be increased up to 4 times that of the first embodiment.

Figure 11:
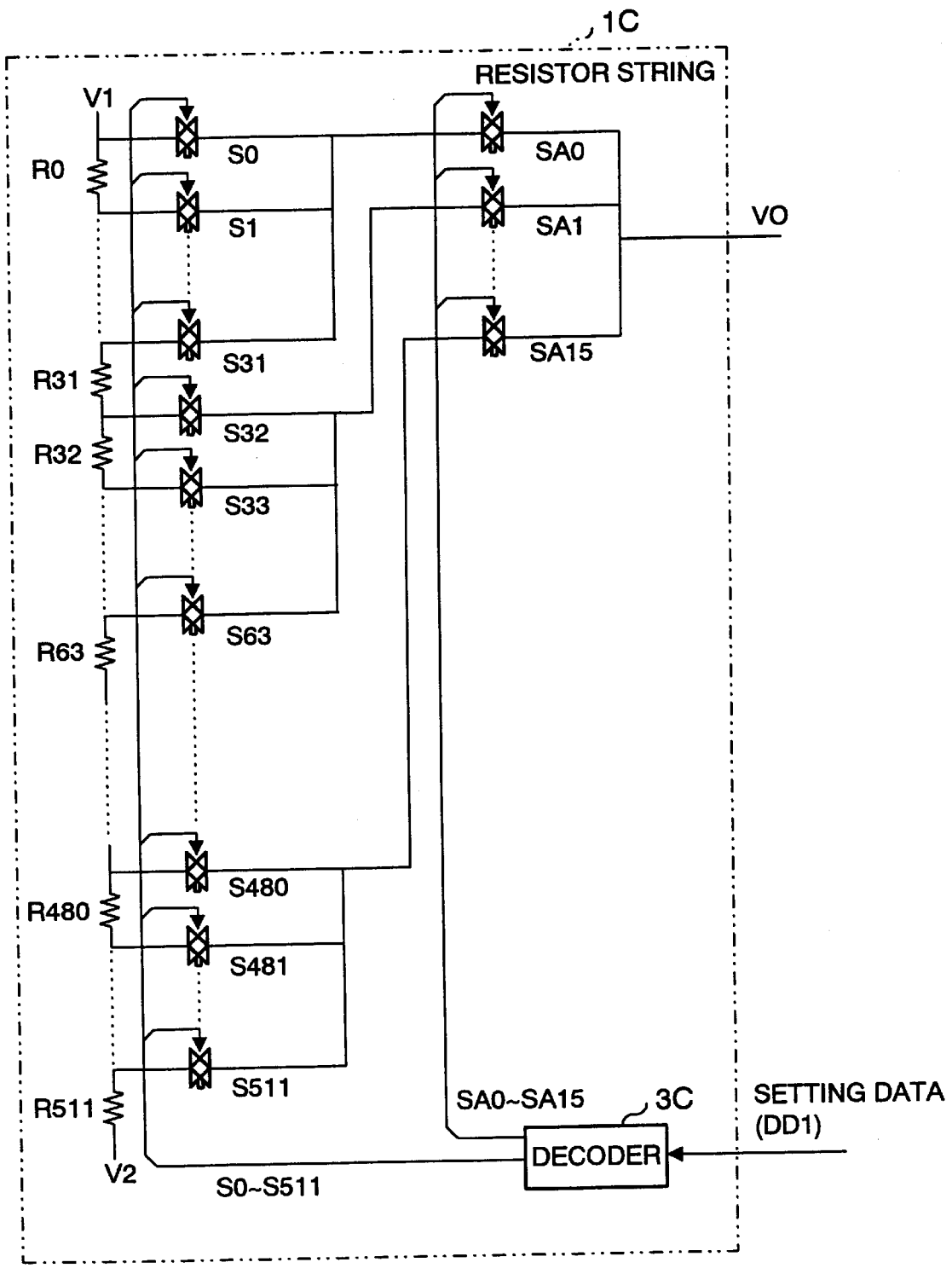
FIG. 11 is a circuit diagram of a resistor string provided in a variable gain amplifier according to a fourth embodiment of the present invention.

A description will now be given, with reference to FIG. 11, of a fourth embodiment of the present invention. FIG. 11 is a circuit diagram of a resistor string 1C provided in a variable gain amplifier according to the fourth embodiment of the present invention. In this embodiment, the setting data DD1 comprises 9 bits, and the number of resistors corresponds to the number of bits of the setting data DD1.

As shown in FIG. 11, the resistor string 1C comprises 512 resistors R0 to R511 which are connected in series, 512 first stage analog switches S0 to S511, 16 second stage analog switches SA0 to SA15 and a decoder 3C. The first stage analog switches S0 to S511 are divided into 16 blocks each of which includes 32 first stage analog switches. That is, the first block includes 32 first stage analog switches S0 to S31, the second block includes 32 first stage analog switches S32 to S63, and so on. One of the blocks is selected by operations of the second stage analog switches SA0 to SA15 which are controlled by a decoded signal output from the decoder 3C. The following Table 3 shows a relationship between each value of the setting data DD1 and a state of each of the analog switches S0 to S511, and the following Table 4 shows a relationship between each value of the setting data DD1 and a state of each of the analog switches SA0 to SA15.

TABLE 3

| DD1 | S0 | S1 | ... | S31 | S32 | S33 | ... | S61 | ... | S480 | S481 | ... | S511 |
|---|---|---|---|---|---|---|---|---|---|---|---|---|---|
| 0 | ON | OFF | ... | OFF | OFF | OFF | ... | OFF | ... | OFF | OFF | ... | OFF |
| 1 | OFF | ON | ... | OFF | OFF | OFF | ... | OFF | ... | OFF | OFF | ... | OFF |
| . | . | . | ... | . | . | . | ... | . | ... | . | . | ... | . |
| . | . | . | ... | . | . | . | ... | . | ... | . | . | ... | . |
| . | . | . | ... | . | . | . | ... | . | ... | . | . | ... | . |
| 31 | OFF | OFF | ... | ON | OFF | OFF | ... | OFF | ... | OFF | OFF | ... | OFF |
| 32 | OFF | OFF | ... | OFF | ON | OFF | ... | OFF | ... | OFF | OFF | ... | OFF |
| 33 | OFF | OFF | ... | OFF | OFF | ON | ... | OFF | ... | OFF | OFF | ... | OFF |
| . | . | . | ... | . | . | . | ... | . | ... | . | . | ... | . |
| . | . | . | ... | . | . | . | ... | . | ... | . | . | ... | . |
| . | . | . | ... | . | . | . | ... | . | ... | . | . | ... | . |
| 61 | OFF | OFF | ... | ON | OFF | OFF | ... | ON | ... | OFF | OFF | ... | OFF |
| . | . | . | ... | . | . | . | ... | . | ... | . | . | ... | . |
| . | . | . | ... | . | . | . | ... | . | ... | . | . | ... | . |
| . | . | . | ... | . | . | . | ... | . | ... | . | . | ... | . |
| 480 | OFF | OFF | ... | OFF | OFF | OFF | ... | OFF | ... | ON | OFF | ... | OFF |
| 481 | OFF | OFF | ... | OFF | OFF | OFF | ... | OFF | ... | OFF | ON | ... | OFF |
| . | . | . | ... | . | . | . | ... | . | ... | . | . | ... | . |
| . | . | . | ... | . | . | . | ... | . | ... | . | . | ... | . |
| . | . | . | ... | . | . | . | ... | . | ... | . | . | ... | . |
| 511 | OFF | OFF | ... | OFF | OFF | OFF | ... | OFF | ... | OFF | OFF | ... | ON |

TABLE 4

| DD1 | SA0 | SA1 | ... | SA15 |
|---|---|---|---|---|
| 0 | ON | OFF | ... | OFF |
| 1 | ON | OFF | ... | OFF |
| . | . | . | ... | . |
| . | . | . | ... | . |
| . | . | . | ... | . |
| 31 | ON | OFF | ... | OFF |
| 32 | OFF | ON | ... | OFF |
| 33 | OFF | ON | ... | OFF |
| . | . | . | ... | . |
| . | . | . | ... | . |
| . | . | . | ... | . |
| 61 | OFF | ON | ... | OFF |
| . | . | . | ... | . |
| . | . | . | ... | . |
| . | . | . | ... | . |
| 480 | OFF | OFF | ... | ON |
| 481 | OFF | OFF | ... | ON |
| . | . | . | ... | . |
| . | . | . | ... | . |
| . | . | . | ... | . |
| 511 | OFF | OFF | ... | ON |

For example, when the setting data DD1 represents a number 33, only the first stage analog switch S33 is selectively turned on from among the first stage analog switches S0 to S511, and also only the second stage analog switch SA1 is selectively turned on from among the second stage analog switches SA0 to SA15.

In a resistor string having only the first stage analog switches R0 to R511, the output voltage V0 is generated by 512 analog switches, and, thereby, a low-pass filter is formed by an ON resistance of the analog switches and a capacitance of the analog switches selecting the output voltage V0. This results in limitation of a bandwidth.

However, in the present embodiment, the number of analog switches which select the output voltage V0 is 16, and only 32 first stage analog switches including the switch being turned on are related to the selection of the output voltage V0 from among 512 first stage analog switches. Additionally, a capacitance of only one of the second stage analog switches SA0 to SA15 is considered. Accordingly, although the two analog switches are connected in series and an ON resistance is doubled, a bandwidth is increased since the capacitance is greatly reduced. Specifically, the bandwidth can be increased as much as five times as indicated below.

Capacitance: $(32+1+16) \times CSW$.

CSW: input and output capacitance of an analog switch.

Resistance: 2RON.

RON: ON resistance of an analog switch.

Time Constant: $49 \times 2 \times CSW \times RON$.

It should be noted that the time constant when only the first stage analog switches are provided becomes $(512 \times 2 \times CSW \times RON)$ which is much larger than the time constant of the present embodiment.

Additionally, when a load capacitance of the string of resistors is considered, the frequency characteristic can be improved by decreasing the ON resistance of the second stage analog switches, that is, increasing the size of the element forming the second stage analog switches. For example, when a load capacitance that is 50 times the input and output capacitance of an analog switch having a minimum size is applied, a bandwidth is increased up to about 3 times as indicated below.

A time constant of a resistor string including only the first stage analog switches:

$$(512+50) \times CSW \times RON$$
$$= 552 \times CSW \times RON.$$

A time constant of the resistor string 1C of the present embodiment when the ON resistance of the second stage analog switches is $\frac{1}{3}$ is represented as follows:

$$(32+3+16 \times 3+50) \times CSW \times (1+\frac{1}{3})RON$$
$$= 177 \times CSW \times RON.$$

Figure 12:
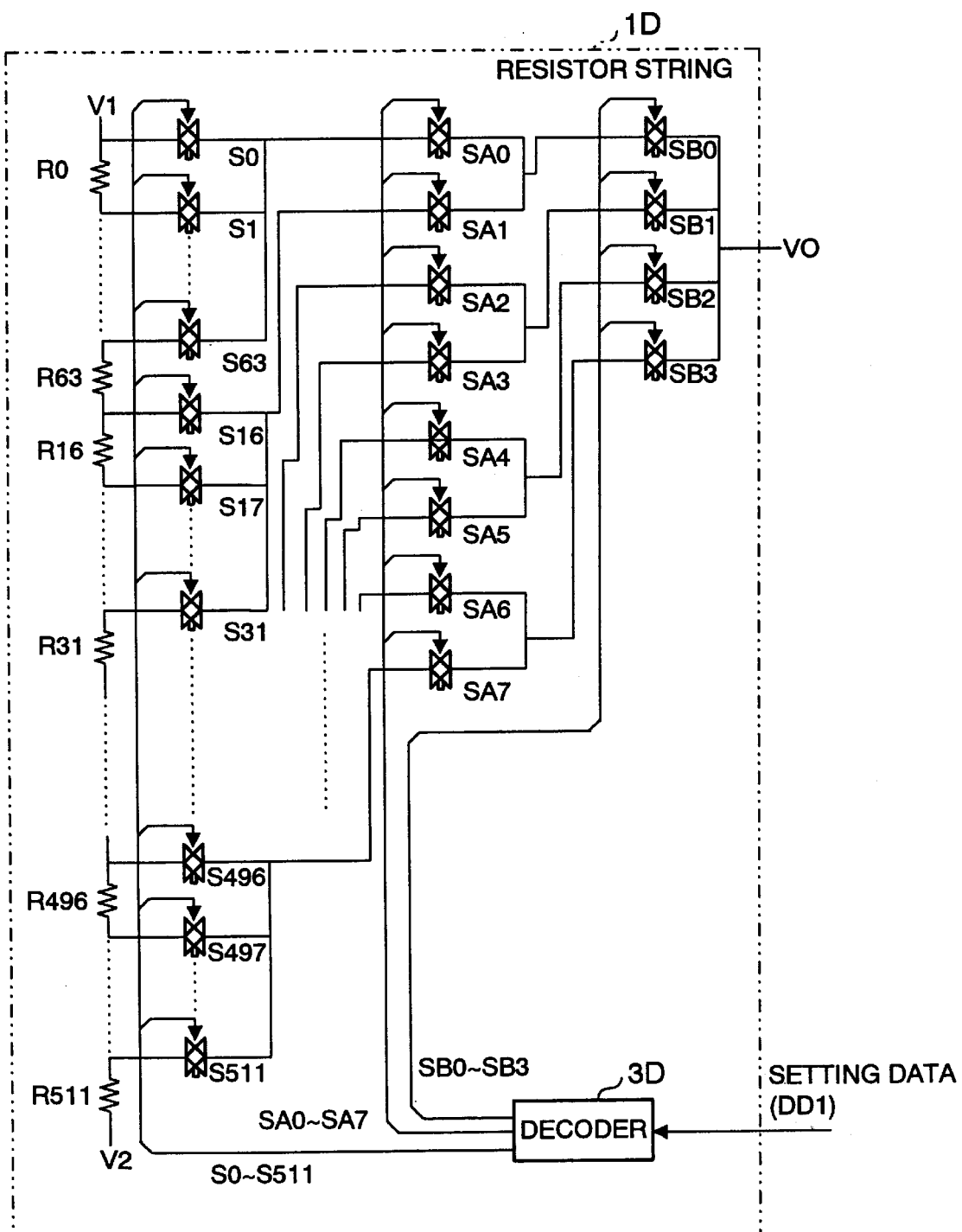
FIG. 12 is a circuit diagram of a resistor string provided in a variable gain amplifier according to a fifth embodiment of the present invention.

A description will now be given, with reference to FIG. 12, of a fifth embodiment of the present invention. FIG. 12 is a circuit diagram of a resistor string 1D provided in a variable gain amplifier according to the fifth embodiment of the present invention. In this embodiment, the setting data DD1 comprises 9 bits, and the number of resistors corresponds to the number of bits of the setting data DD1.

As shown in FIG. 12, the resistor string 1D comprises 512 resistors R0 to R511 which are connected in series, 512 first stage analog switches S0 to S511, 8 second stage analog switches SA0 to SA7, 4 third stage analog switches SB0 to SB3 and a decoder 3D. The first stage analog switches S0 to S511 are divided into 8 blocks each of which includes 64 decoded signal output from the decoder 3D. The following Table 5 shows a relationship between each value of the setting data DD1 and a state of each of the analog switches S0 to S511, and the following Table 6 shows a relationship between each value of the setting data DD1 and a state of each of the analog switches SA0 to SA7 and SB0 to SB3.

TABLE 5

| DD1 | S0 | S1 | ... | S15 | S16 | S17 | ... | S31 | ... | S496 | S497 | ... | S511 |
|---|---|---|---|---|---|---|---|---|---|---|---|---|---|
| 0 | ON | OFF | ... | OFF | OFF | OFF | ... | OFF | ... | OFF | OFF | ... | OFF |
| 1 | OFF | ON | ... | OFF | OFF | OFF | ... | OFF | ... | OFF | OFF | ... | OFF |
| . | . | . | ... | . | . | . | ... | . | ... | . | . | ... | . |
| . | . | . | ... | . | . | . | ... | . | ... | . | . | ... | . |
| 15 | OFF | OFF | ... | ON | OFF | OFF | ... | OFF | ... | OFF | OFF | ... | OFF |
| 16 | OFF | OFF | ... | OFF | ON | OFF | ... | OFF | ... | OFF | OFF | ... | OFF |
| 17 | OFF | OFF | ... | OFF | OFF | ON | ... | OFF | ... | OFF | OFF | ... | OFF |
| . | . | . | ... | . | . | . | ... | . | ... | . | . | ... | . |
| . | . | . | ... | . | . | . | ... | . | ... | . | . | ... | . |
| 31 | OFF | OFF | ... | ON | OFF | OFF | ... | ON | ... | OFF | OFF | ... | OFF |
| . | . | . | ... | . | . | . | ... | . | ... | . | . | ... | . |
| . | . | . | ... | . | . | . | ... | . | ... | . | . | ... | . |
| 496 | OFF | OFF | ... | OFF | OFF | OFF | ... | OFF | ... | ON | OFF | ... | OFF |
| 497 | OFF | OFF | ... | OFF | OFF | OFF | ... | OFF | ... | OFF | ON | ... | OFF |
| . | . | . | ... | . | . | . | ... | . | ... | . | . | ... | . |
| . | . | . | ... | . | . | . | ... | . | ... | . | . | ... | . |
| 511 | OFF | OFF | ... | OFF | OFF | OFF | ... | OFF | ... | OFF | OFF | ... | ON |

TABLE 6

| DD1 | SA0 | SA1 | SA2 | SA3 | SA4 | SA5 | SA6 | SA7 | SB0 | SB1 | SB2 | SB3 |
|---|---|---|---|---|---|---|---|---|---|---|---|---|
| 0 | ON | OFF | OFF | OFF | OFF | OFF | OFF | OFF | ON | OFF | OFF | OFF |
| 1 | ON | OFF | OFF | OFF | OFF | OFF | OFF | OFF | ON | OFF | OFF | OFF |
| . | . | . | . | . | . | . | . | . | . | . | . | . |
| . | . | . | . | . | . | . | . | . | . | . | . | . |
| 15 | ON | OFF | OFF | OFF | OFF | OFF | OFF | OFF | ON | OFF | OFF | OFF |
| 16 | OFF | ON | OFF | OFF | OFF | OFF | OFF | OFF | ON | OFF | OFF | OFF |
| 17 | OFF | ON | OFF | OFF | OFF | OFF | OFF | OFF | ON | OFF | OFF | OFF |
| . | . | . | . | . | . | . | . | . | . | . | . | . |
| . | . | . | . | . | . | . | . | . | . | . | . | . |
| 31 | OFF | ON | OFF | OFF | OFF | OFF | OFF | OFF | ON | OFF | OFF | OFF |
| . | . | . | . | . | . | . | . | . | . | . | . | . |
| . | . | . | . | . | . | . | . | . | . | . | . | . |
| 496 | OFF | OFF | OFF | OFF | OFF | OFF | OFF | ON | OFF | OFF | OFF | ON |
| 497 | OFF | OFF | OFF | OFF | OFF | OFF | OFF | ON | OFF | OFF | OFF | ON |
| . | . | . | . | . | . | . | . | . | . | . | . | . |
| . | . | . | . | . | . | . | . | . | . | . | . | . |
| 511 | OFF | OFF | OFF | OFF | OFF | OFF | OFF | ON | OFF | OFF | OFF | ON | first stage analog switches. That is, the first block includes 64 first stage analog switches S0 to S63, the second block includes 64 first stage analog switches S64 to S127, and so on. One of the blocks is selected by operations of the second stage analog switches SA0 to SA7 which are controlled by a decoded signal output from the decoder 3D. Additionally, the second stage analog switches SA0 to SA7 are divided into 4 blocks each of which includes 2 second stage analog switches. That is, the first block includes 2 second stage analog switches SA0 and SA1, the second block includes 2 second stage analog switches SA2 and SA3, and so on. One of the blocks is selected by operations of the third stage analog switches SB0 to SB3 which are controlled by a The followings are results of comparison of the time constant when a resistor string including only the first stage analog switches is used and the time constant when the resistor string 1D according to the present embodiment is used.

<when no load is applied>

The time constant when a resistor string including only the first stage analog switches is used:
  512×CSW×RON.

The time constant when the resistor string 1D according to the present embodiment is used:
  72×CSW×RON.

<when a load (50×CSW) is applied>

The time constant when a resistor string including only the first stage analog switches is used:
  562×CSW×RON.

The time constant when the resistor string 1D according to the present embodiment is used:

146×CSW×RON.

(second stage: RON/5, third stage: RON/4)

Accordingly, the bandwidth reaches 7 times when no load is applied, and the bandwidth reaches 3.8 times when a load is 50 times the input and output capacitance of the analog switch.

Figure 13:
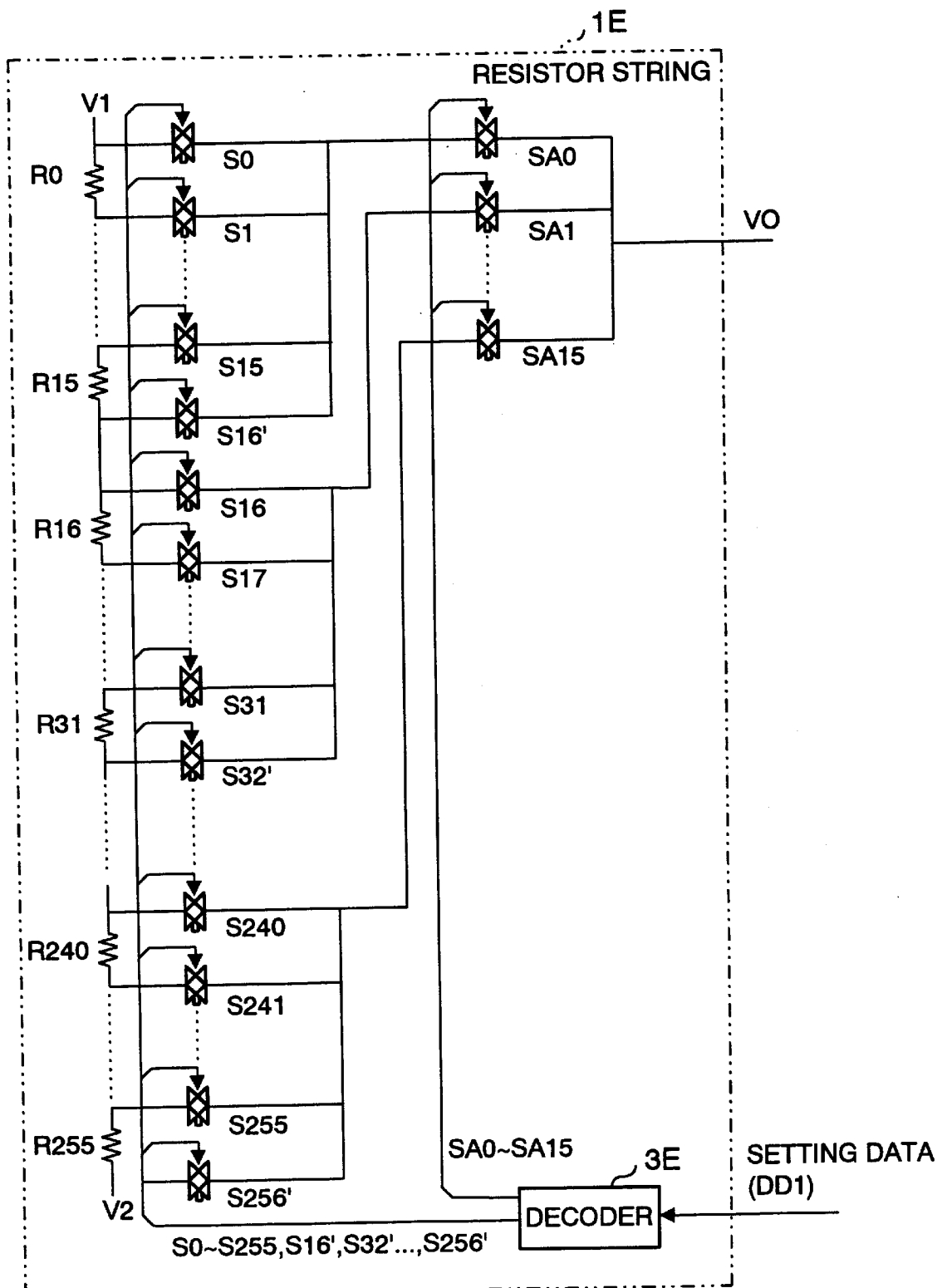
FIG. 13 is a circuit diagram of a resistor string provided in a variable gain amplifier according to a sixth embodiment of the present invention.

A description will now be given, with reference to FIG. 13, of a sixth embodiment of the present invention. FIG. 13 is a circuit diagram of a resistor string 1E provided in a variable gain amplifier according to the sixth embodiment of the present invention. In this embodiment, the setting data DD1 comprises 9 bits.

As shown in FIG. 13, the resistor string 1E comprises 256 resistors R0 to R255 which are connected in series, 272 first stage analog switches S0 to S255 and S16', S32', ..., S256', 16 second stage analog switches SA0 to SA15 and a decoder 3E. The first stage analog switches S0 to S255 and S16' to S256' are divided into 16 blocks each of which includes 17 (16+1) first stage analog switches. That is, the first block includes 16 first stage analog switches S0 to S15 and S16', the second block includes 16 first stage analog switches S16 to S31 and S32', and so on. One of the blocks is selected by operations of the second stage analog switches SA0 to SA15 which are controlled by a decoded signal output from the decoder 3E. The following Table 7 shows a relationship between each value of the setting data DD1 and a state of each of the analog switches S0 to S31; the following Table 8 shows a relationship between each value of the setting data DD1 and a state of each of the analog switches S32' to S256'; and the following Table 9 shows a relationship between each value of the setting data DD1 and a state of each of the analog switches SA1 to SA15.

TABLE 7

| DD1 | S0 | S1 | ... | S15 | S16' | S16 | S17 | ... | S31 |
|---|---|---|---|---|---|---|---|---|---|
| 0 | ON | OFF | ... | OFF | OFF | OFF | OFF | ... | OFF |
| 1 | ON | ON | ... | OFF | OFF | OFF | OFF | ... | OFF |
| 2 | OFF | ON | ... | OFF | OFF | OFF | OFF | ... | OFF |
| 3 | OFF | ON | ... | OFF | OFF | OFF | OFF | ... | OFF |
| . | . | . | ... | . | . | . | . | ... | . |
| . | . | . | ... | . | . | . | . | ... | . |
| 30 | OFF | OFF | ... | ON | OFF | OFF | OFF | ... | OFF |
| 31 | OFF | OFF | ... | ON | ON | OFF | OFF | ... | OFF |
| 32 | OFF | OFF | ... | OFF | OFF | ON | OFF | ... | OFF |
| 33 | OFF | OFF | ... | OFF | OFF | ON | ON | ... | OFF |
| 34 | OFF | OFF | ... | OFF | OFF | OFF | ON | ... | OFF |
| 35 | OFF | OFF | ... | OFF | OFF | OFF | ON | ... | OFF |
| . | . | . | ... | . | . | . | . | ... | . |
| . | . | . | ... | . | . | . | . | ... | . |
| 62 | OFF | OFF | ... | OFF | OFF | OFF | OFF | ... | ON |
| 63 | OFF | OFF | ... | OFF | OFF | OFF | OFF | ... | ON |
| 64 | OFF | OFF | ... | OFF | OFF | OFF | OFF | ... | OFF |
| . | . | . | ... | . | . | . | . | ... | . |
| . | . | . | ... | . | . | . | . | ... | . |
| 480 | OFF | OFF | ... | OFF | OFF | OFF | OFF | ... | OFF |
| 481 | OFF | OFF | ... | OFF | OFF | OFF | OFF | ... | OFF |
| 482 | OFF | OFF | ... | OFF | OFF | OFF | OFF | ... | OFF |
| 483 | OFF | OFF | ... | OFF | OFF | OFF | OFF | ... | OFF |
| . | . | . | ... | . | . | . | . | ... | . |
| . | . | . | ... | . | . | . | . | ... | . |
| 510 | OFF | OFF | ... | OFF | OFF | OFF | OFF | ... | OFF |
| 511 | OFF | OFF | ... | OFF | OFF | OFF | OFF | ... | OFF |

TABLE 8

| DD1 | S32' | ... | S240 | S241 | ... | S255 | S256' |
|---|---|---|---|---|---|---|---|
| 0 | OFF | ... | OFF | OFF | ... | OFF | OFF |
| 1 | OFF | ... | OFF | OFF | ... | OFF | OFF |
| 2 | OFF | ... | OFF | OFF | ... | OFF | OFF |
| 3 | OFF | ... | OFF | OFF | ... | OFF | OFF |
| . | . | ... | . | . | ... | . | . |
| . | . | ... | . | . | ... | . | . |
| 30 | OFF | ... | OFF | OFF | ... | OFF | OFF |
| 31 | OFF | ... | OFF | OFF | ... | OFF | OFF |
| 32 | OFF | ... | OFF | OFF | ... | OFF | OFF |
| 33 | OFF | ... | OFF | OFF | ... | OFF | OFF |
| 34 | OFF | ... | OFF | OFF | ... | OFF | OFF |
| 35 | OFF | ... | OFF | OFF | ... | OFF | OFF |
| . | . | ... | . | . | ... | . | . |
| . | . | ... | . | . | ... | . | . |
| 62 | OFF | ... | OFF | OFF | ... | OFF | OFF |
| 63 | ON | ... | OFF | OFF | ... | OFF | OFF |
| 64 | OFF | ... | OFF | OFF | ... | OFF | OFF |
| . | . | ... | . | . | ... | . | . |
| . | . | ... | . | . | ... | . | . |
| 480 | OFF | ... | ON | OFF | ... | OFF | OFF |
| 481 | OFF | ... | ON | ON | ... | OFF | OFF |
| 482 | OFF | ... | OFF | ON | ... | OFF | OFF |
| 483 | OFF | ... | OFF | ON | ... | OFF | OFF |
| . | . | ... | . | . | ... | . | . |
| . | . | ... | . | . | ... | . | . |
| 510 | OFF | ... | OFF | OFF | ... | ON | OFF |
| 511 | OFF | ... | OFF | OFF | ... | ON | ON |

TABLE 9

| DD1 | SA0 | SA1 | ... | SA15 |
|---|---|---|---|---|
| 0 | ON | OFF | ... | OFF |
| 1 | ON | OFF | ... | OFF |
| 2 | ON | OFF | ... | OFF |
| 3 | ON | OFF | ... | OFF |
| . | . | . | ... | . |
| . | . | . | ... | . |
| 30 | ON | OFF | ... | OFF |
| 31 | ON | OFF | ... | OFF |
| 32 | OFF | ON | ... | OFF |
| 33 | OFF | ON | ... | OFF |
| 34 | OFF | ON | ... | OFF |
| 35 | OFF | ON | ... | OFF |
| . | . | . | ... | . |
| . | . | . | ... | . |
| 62 | OFF | ON | ... | OFF |
| 63 | OFF | ON | ... | OFF |
| 64 | OFF | OFF | ... | OFF |
| . | . | . | ... | . |
| . | . | . | ... | . |
| 480 | OFF | OFF | ... | ON |
| 481 | OFF | OFF | ... | ON |
| 482 | OFF | OFF | ... | ON |
| 483 | OFF | OFF | ... | ON |
| . | . | . | ... | . |
| . | . | . | ... | . |
| 510 | OFF | OFF | ... | ON |
| 511 | OFF | OFF | ... | ON |

The followings are a comparison of the time constant when a resistor string including only the first stage analog switches is used and when the resistor string 1E according to the present embodiment is used.

<when no load is applied>

The time constant when a resistor string including only the first stage analog switches is used:

512×CSW×RON.

The time constant when the resistor string 1D according to the present embodiment is used:

34×CSW×RON.

<when a load (50×CSW) is applied>

The time constant when a resistor string including only the first stage analog switches is used:

562×CSW×RON.

The time constant when the resistor string 1D according to the present embodiment is used:

153×CSW×RON.

(second stage: RON/3)

Accordingly, the bandwidth reaches 15 times when no load is applied, and the bandwidth reaches 3.6 times when a load is 50 times the input and output capacitance of the analog switch. Additionally, since the number of resistors which occupy a major part of an area factor is reduced in half, there is a large effect for reducing an area.

Figure 14:
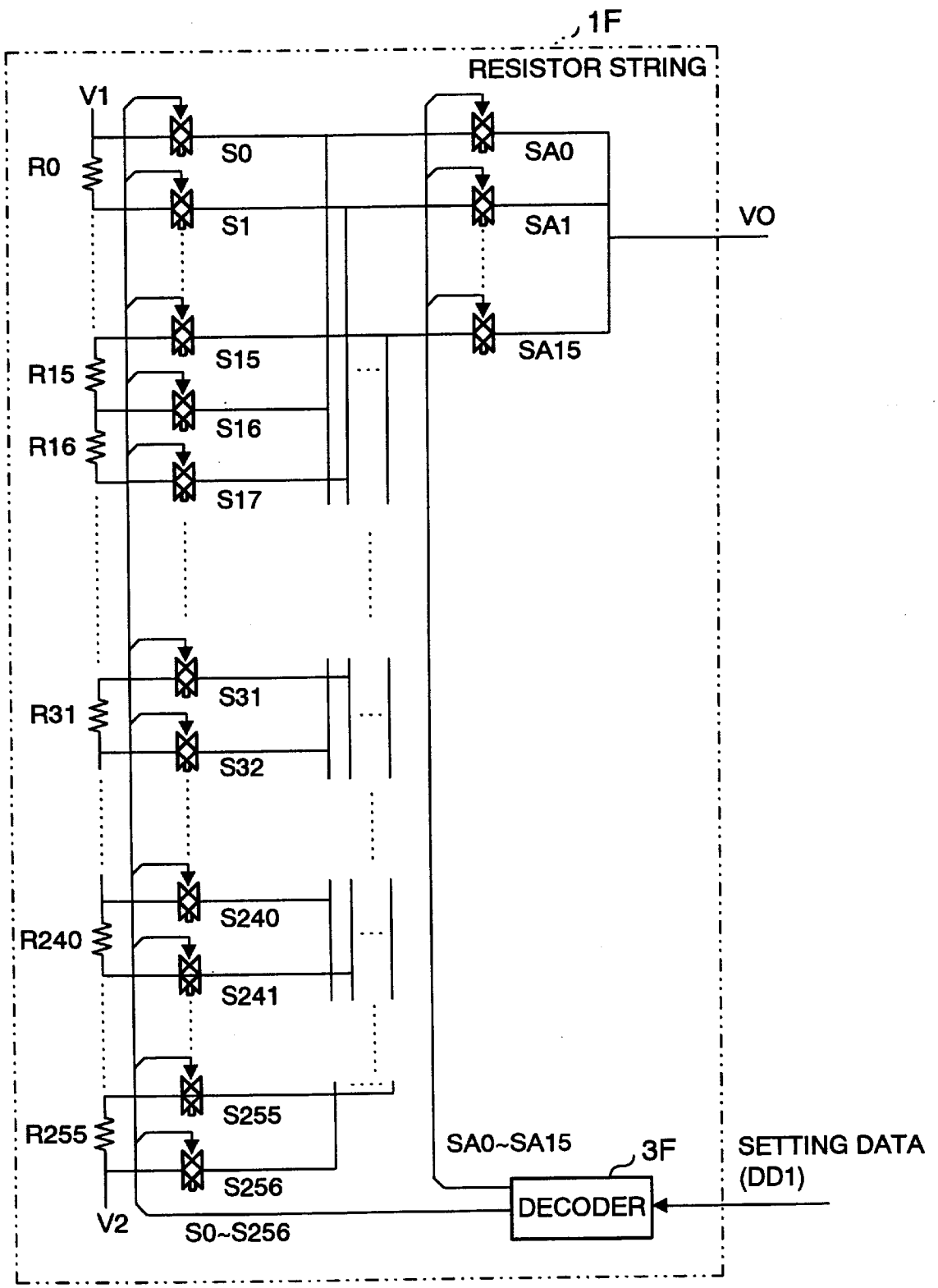
FIG. 14 is a circuit diagram of a resistor string provided in a variable gain amplifier according to a seventh embodiment of the present invention.

A description will now be given, with reference to FIG. 14, of a seventh embodiment of the present invention. FIG. 14 is a circuit diagram of a resistor string 1F provided in a variable gain amplifier according to the seventh embodiment of the present invention. In this embodiment, the setting data DD1 comprises 9 bits.

As shown in FIG. 14, the resistor string 1F comprises 256 resistors R0 to R255 which are connected in series, 257 first stage analog switches S0 to S256, 16 second stage analog switches SA0 to SA15 and a decoder 3F. The first stage analog switches S0 to SS256 are divided into 16 blocks each of which includes 16 first stage analog switches except for the first block including 17 first stage analog switches. That is, the first block includes 17 first stage analog switches S0, S16, S32, . . . and S256, the second block includes 16 first stage analog switches S1, S17, S33, . . . and S241, and so on. One of the blocks is selected by operations of the second stage analog switches SA0 to SA15 which are controlled by a decoded signal output from the decoder 3F. The following Table 10 shows a relationship between each value of the setting data DD1 and a state of each of the analog switches S0 to S17; the following Table 11 shows a relationship between each value of the setting data DD1 and a state of each of the analog switches S31 to S256; and the following Table 12 shows a relationship between each value of the setting data DD1 and a state of each of the analog switches SA1 to SA15.

TABLE 10

| DD1 | S0 | S1 | ... | S15 | S16 | S17 | ... |
|---|---|---|---|---|---|---|---|
| 0 | ON | OFF | ... | OFF | OFF | OFF | ... |
| 1 | ON | ON | ... | OFF | OFF | OFF | ... |
| 2 | OFF | ON | ... | OFF | OFF | OFF | ... |
| 3 | OFF | ON | ... | OFF | OFF | OFF | ... |
| . | . | . | ... | . | . | . | ... |
| . | . | . | ... | . | . | . | ... |
| 30 | OFF | OFF | ... | ON | OFF | OFF | ... |
| 31 | OFF | OFF | ... | ON | ON | OFF | ... |
| 32 | OFF | OFF | ... | OFF | ON | OFF | ... |

TABLE 10-continued

| DD1 | S0 | S1 | ... | S15 | S16 | S17 | ... |
|---|---|---|---|---|---|---|---|
| 33 | OFF | OFF | ... | OFF | ON | ON | ... |
| 34 | OFF | OFF | ... | OFF | OFF | ON | ... |
| 35 | OFF | OFF | ... | OFF | OFF | ON | ... |
| . | . | . | ... | . | . | . | ... |
| . | . | . | ... | . | . | . | ... |
| 62 | OFF | OFF | ... | OFF | OFF | OFF | ... |
| 63 | OFF | OFF | ... | OFF | OFF | OFF | ... |
| 64 | OFF | OFF | ... | OFF | OFF | OFF | ... |
| . | . | . | ... | . | . | . | ... |
| . | . | . | ... | . | . | . | ... |
| 480 | OFF | OFF | ... | OFF | OFF | OFF | ... |
| 481 | OFF | OFF | ... | OFF | OFF | OFF | ... |
| 482 | OFF | OFF | ... | OFF | OFF | OFF | ... |
| 483 | OFF | OFF | ... | OFF | OFF | OFF | ... |
| . | . | . | ... | . | . | . | ... |
| . | . | . | ... | . | . | . | ... |
| 510 | OFF | OFF | ... | OFF | OFF | OFF | ... |
| 511 | OFF | OFF | ... | OFF | OFF | OFF | ... |

TABLE 11

| DD1 | S31 | S32 | ... | S240 | S241 | ... | S255 | S258 |
|---|---|---|---|---|---|---|---|---|
| 0 | OFF | OFF | ... | OFF | OFF | ... | OFF | OFF |
| 1 | OFF | OFF | ... | OFF | OFF | ... | OFF | OFF |
| 2 | OFF | OFF | ... | OFF | OFF | ... | OFF | OFF |
| 3 | OFF | OFF | ... | OFF | OFF | ... | OFF | OFF |
| . | . | . | ... | . | . | ... | . | . |
| . | . | . | ... | . | . | ... | . | . |
| 30 | OFF | OFF | ... | OFF | OFF | ... | OFF | OFF |
| 31 | OFF | OFF | ... | OFF | OFF | ... | OFF | OFF |
| 32 | OFF | OFF | ... | OFF | OFF | ... | OFF | OFF |
| 33 | OFF | OFF | ... | OFF | OFF | ... | OFF | OFF |
| 34 | OFF | OFF | ... | OFF | OFF | ... | OFF | OFF |
| 35 | OFF | OFF | ... | OFF | OFF | ... | OFF | OFF |
| . | . | . | ... | . | . | ... | . | . |
| . | . | . | ... | . | . | ... | . | . |
| 62 | ON | OFF | ... | OFF | OFF | ... | OFF | OFF |
| 63 | ON | ON | ... | OFF | OFF | ... | OFF | OFF |
| 64 | OFF | ON | ... | OFF | OFF | ... | OFF | OFF |
| . | . | . | ... | . | . | ... | . | . |
| . | . | . | ... | . | . | ... | . | . |
| 480 | OFF | OFF | ... | ON | OFF | ... | OFF | OFF |
| 481 | OFF | OFF | ... | ON | ON | ... | OFF | OFF |
| 482 | OFF | OFF | ... | OFF | ON | ... | OFF | OFF |
| 483 | OFF | OFF | ... | OFF | ON | ... | OFF | OFF |
| . | . | . | ... | . | . | ... | . | . |
| . | . | . | ... | . | . | ... | . | . |
| 510 | OFF | OFF | ... | OFF | OFF | ... | ON | OFF |
| 511 | OFF | OFF | ... | OFF | OFF | ... | ON | ON |

TABLE 12

| DD1 | SA0 | SA1 | ... | SA15 |
|---|---|---|---|---|
| 0 | ON | OFF | ... | OFF |
| 1 | ON | ON | ... | OFF |
| 2 | OFF | ON | ... | OFF |
| 3 | OFF | ON | ... | OFF |
| . | . | . | ... | . |
| . | . | . | ... | . |
| 30 | OFF | OFF | ... | ON |
| 31 | ON | OFF | ... | ON |
| 32 | ON | OFF | ... | OFF |

TABLE 12-continued

| DD1 | SA0 | SA1 | ... | SA15 |
|---|---|---|---|---|
| 33 | ON | ON | ... | OFF |
| 34 | OFF | ON | ... | OFF |
| 35 | OFF | ON | ... | OFF |
| . | . | . | ... | . |
| . | . | . | ... | . |
| . | . | . | ... | . |
| 62 | OFF | OFF | ... | ON |
| 63 | ON | OFF | ... | ON |
| 64 | ON | OFF | ... | OFF |
| . | . | . | ... | . |
| . | . | . | ... | . |
| . | . | . | ... | . |
| 480 | ON | OFF | ... | ON |
| 481 | ON | ON | ... | ON |
| 482 | OFF | ON | ... | ON |
| 483 | OFF | ON | ... | ON |
| . | . | . | ... | . |
| . | . | . | ... | . |
| . | . | . | ... | . |
| 510 | OFF | OFF | ... | ON |
| 511 | ON | OFF | ... | ON |

The followings are a comparison of the time constant when a resistor string including only the first stage analog switches is used and when the resistor string 1F according to the present embodiment is used.

<when no load is applied>

The time constant when a resistor string including only the first stage analog switches is used:

512×CSW×RON.

The time constant when the resistor string 1D according to the present embodiment is used:

33×CSW×RON

<when a load (50×CSW) is applied>

The time constant when a resistor string including only the first stage analog switches is used:

562×CSW×RON.

The time constant when the resistor string 1D according to the present embodiment is used:

153×CSW×RON.

(second stage: RON/3)

Accordingly, the bandwidth reaches 15 times when no load is applied, and the bandwidth reaches 3.6 times when a load is 50 times the input and output capacitance of the analog switch. Additionally, since the number of resistors which occupy a major part of an area factor is reduced in half, there is a large effect of reducing an area.

Figure 15:
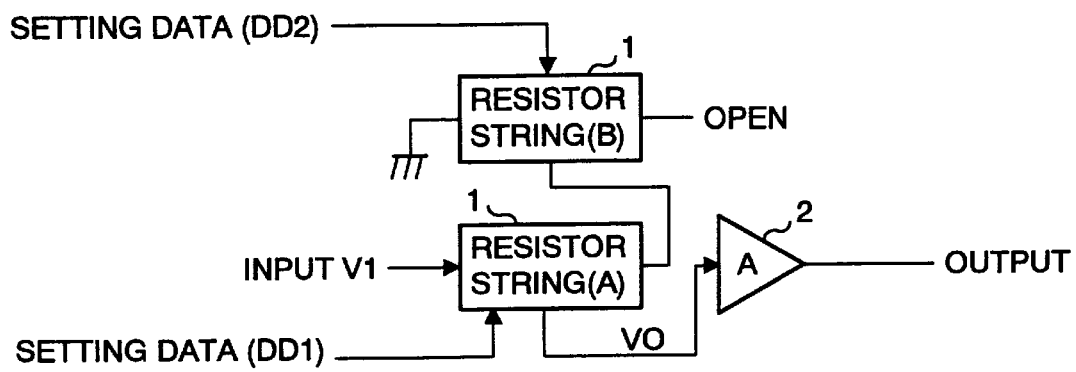
FIG. 15 is a block diagram of a variable gain amplifier according to an eighth embodiment of the present invention.

A description will now be given, with reference to FIG. 15, of an eighth embodiment of the present invention. FIG. 15 is a block diagram of a variable gain amplifier according to the eighth embodiment of the present invention.

The variable gain amplifier shown in FIG. 15 comprises a resistor string (A), a resistor string (B) and a fixed gain amplifier 2. The resistor string (A) and the register string (B) are connected in series. Each of the resistor string (A) and the resistor string (B) can be one of the above-mentioned resistor strings 1 to 1F (in FIG. 15, the resistor string 1 is used). Setting data DD1 is supplied to the resistor string (A), and setting data DD2 is supplied to the resistor string (B). In the variable gain amplifier shown in FIG. 15, an output voltage V0 output from the resistor string (A) is input to the fixed gain amplifier 2. When a voltage V1 is input to the resistor string (A), the output voltage V0 is represented by the following equation;

$$V0=V1\times(RA\times DD1/2^l+RB\times DD2/2^m)/(RA+RB\times DD2/2^m).$$

where RA is a total resistance of the string of resistors included in resistor string (A); RB is a total resistance of the string of resistors included in resistor string (B); l is a number of bits of the setting data DD1; and m is a number of bits of the setting data DD2.

When RA=RB, and each of the setting data DD1 and the setting data DD2 comprises 8 bits, and if the setting data DD2 is 255 (DD2=255), the attenuation factor is (DD1+255)/511. In this case, if the setting data DD1 varies from 0 to 255, the attenuation factor varies from 255/511 to 510/511 and the step value is 1/511. Additionally, if the setting data DD2 is 128 (DD2=128), the attenuation factor is (DD1+128)/384. In this case, if the setting data DD1 varies from 0 to 255, the attenuation factor varies from 128/384 to 383/384 and the step value is 1/384. Accordingly, the maximum attenuation factor can be arbitrarily set, and a fine step can be achieved.

Figure 16:
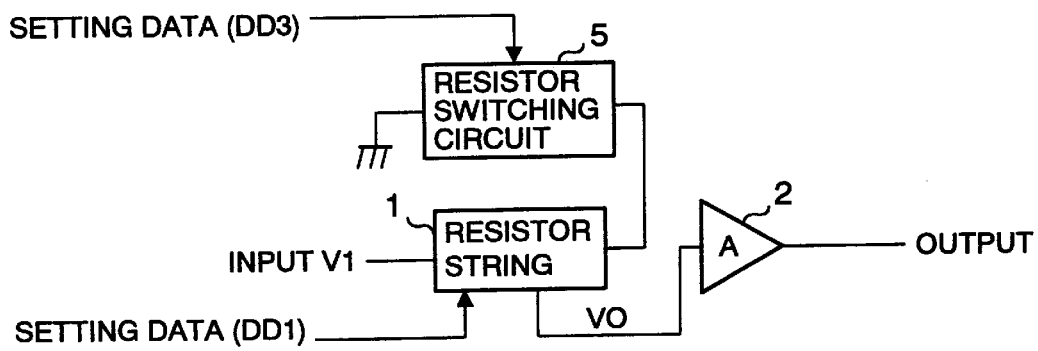
FIG. 16 is a block diagram of a variable gain amplifier according to a ninth embodiment of the present invention.
Figure 17:
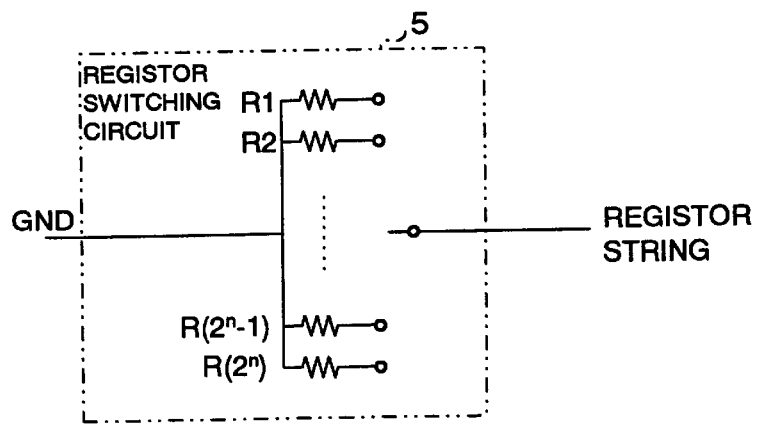
FIG. 17 is a circuit diagram of a resistor switching circuit shown in FIG. 16.

A description will now be given, with reference to FIGS. 16 and 17, of a ninth embodiment of the present invention. FIG. 16 is a block diagram of a variable gain amplifier according to the ninth embodiment of the present invention.

The variable gain amplifier shown in FIG. 16 comprises one of the above-mentioned resistor strings 1 to 1F (in FIG. 16, the resistor string 1 is used), a resistor switching circuit 5 and the fixed gain amplifier 2. The resistor switching circuit 5 and the resistor string 1 are connected in series. Setting data DD1 is supplied to the resistor string 1, and setting data DD3 is supplied to the resistor switching circuit 5. In the variable gain amplifier shown in FIG. 16, an output voltage V0 output from the resistor string 1 is input to the fixed gain amplifier 2. The resistor switching circuit 5 has a circuit structure as shown in FIG. 17.

When a voltage V1 is input to the resistor string 1, the output voltage V0 is represented by the following equation;

$$V0=V1\times(Ri+R\times DD1/2^l)/(R+Ri)$$

where R is a total resistance of the string of resistors included in resistor string 1; and Ri is a resistance of a resistor selected by the resistor switching circuit 5.

When the setting data DD1 comprises 8 bits, and if Ri=R, the attenuation factor is (1+DD1/256)/2. In this case, when the setting data DD1 varies from 0 to 255, the attenuation factor varies from 256/512 to 511/512 and a step value is 1/512. If Ri=R/2, the attenuation factor varies from 128/384 to 368/384 and a step value is 1/384. Thus, an arbitrary fine step can be achieved.

A description will now be given, with reference to FIG. 18, of a tenth embodiment of the present invention. FIG. 18 is a block diagram of a variable gain amplifier according to the tenth embodiment of the present invention.

The variable gain amplifier shown in FIG. 18 comprises a resistor string (A) which is connected to the resistor switching circuit 5, an operational amplifier 6 having a differential amplifier structure and a resistor string (C). The resistor switching circuit 5 and the resistor string (A) are connected in series. The setting data DD1 is supplied to the resistor string (A), the setting data DD3 is supplied to the resistor switching circuit 5, and the setting data DD4 is supplied to the resistor string (C). It should be noted that one of the above-mentioned resistor strings 1 to 1F can be used for each of the resistor string (A) and the resistor string (C). In FIG. 18, the resistor string 1 is used for each of the resistor string (A) and the resistor string (C). An output voltage from the resistor string (A) is input to a normal phase input terminal of the operational amplifier 6. A feedback output of the resistor string (C) is input to a reverse phase input terminal of the operational amplifier 6.

A gain obtained by the variable gain amplifier according to this embodiment is as follows:

$$(Ri+R \times DD1/2^{т})/(R+Ri) \times (2^S/DD4),$$

where R is a total resistance of the string of resistors included in resistor string (A); Ri is a resistance of a resistor selected by the resistor switching circuit 5; and S is a number of bits of the setting data DD4.

The variable gain amplifier according to the present embodiment has a gain curve similar to that of the variable gain amplifier according to the above-mentioned ninth embodiment.

A description will now be given, with reference to FIG. 19, of an eleventh embodiment of the present invention. FIG. 19 is a block diagram of a variable gain amplifier according to the eleventh embodiment of the present invention.

As shown in FIG. 19, the variable gain amplifier according to the eleventh embodiment has the same structure as the variable gain amplifier according to the above-mentioned tenth embodiment except for a resistor switching circuit (B) 8 being provided in a feedback loop of the resistor string (C).

A gain obtained by the variable gain amplifier according to this embodiment is as follows:

$$[(Ri+R \times DD1/2^{т})/(R+Ri)] \times (2^S/DD4) \times [(R+Rj)/Rj],$$

where R is a total resistance of the string of resistors included in resistor string (A); Ri is a resistance of a resistor selected by the resistor switching circuit 5; and S is a number of bits of the setting data DD4.

The variable gain amplifier according to the present embodiment has a gain curve similar to that of the variable gain amplifier according to the above-mentioned ninth embodiment. Additionally, a minimum gain can be changed by changing setting data DD5 supplied to the resistor switching circuit (B).

Figure 20:
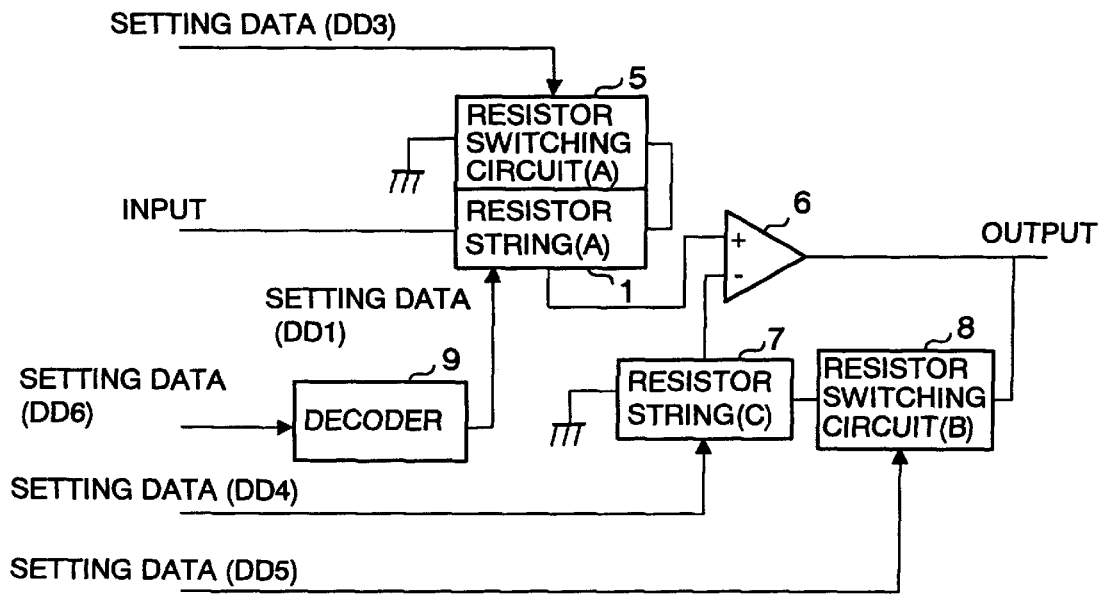
FIG. 20 is a block diagram of a variable gain amplifier according to a twelfth embodiment of the present invention.
Figure 21:
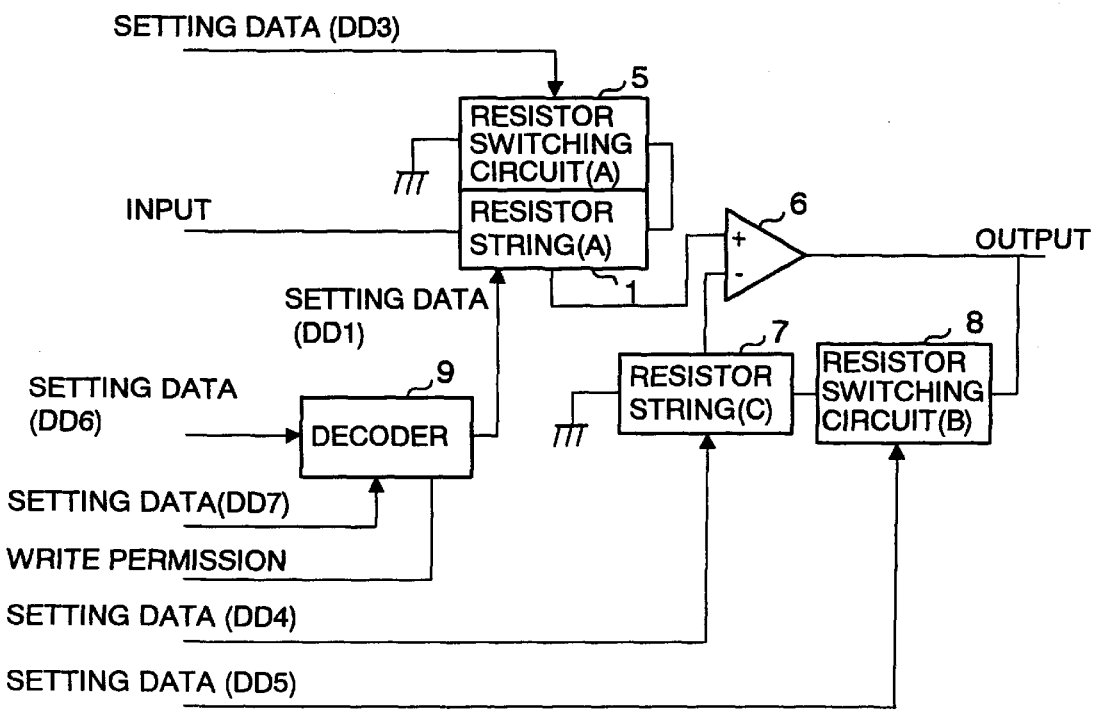
FIG. 21 is a block diagram of a variable gain amplifier according to a thirteenth embodiment of the present invention.

A description will now be given, with reference to FIG. 20, of a twelfth embodiment of the present invention. FIG. 20 is a block diagram of a variable gain amplifier according to the twelfth embodiment of the present invention.

As shown in FIG. 20, the variable gain amplifier according to the twelfth embodiment has the same structure as the variable gain amplifier according to the above-mentioned eleventh embodiment except for a decoder 9 being provided so as to supply the setting data DD1 to the resistor string (A) via the decoder 9.

A gain obtained by the variable gain amplifier according to this embodiment is as follows:

$$[(Ri+R \times DD1/2^{т})/(R+Ri)] \times (2^S/DD4) \times [(R+Rj)/Rj],$$

where R is a total resistance of the string of resistors included in resistor string (A); Ri is a resistance of a resistor selected by the resistor switching circuit 5; a S is a number of bits of the setting data DD4.

According to the above-mentioned gain setting structure, an unnecessarily fine step is set in accordance with a gain to be set. In order to eliminate such an unnecessary fine step, setting data DD6 is supplied to the decoder 9 so that the setting data DD1 is generated by the decoder 9 according to the setting data DD6 and the thus-generated setting data DD1 is supplied to the resistor string (A). The number of bits of the setting data DD6 is smaller than the number of bits of the setting data DD1.

Figure 22:
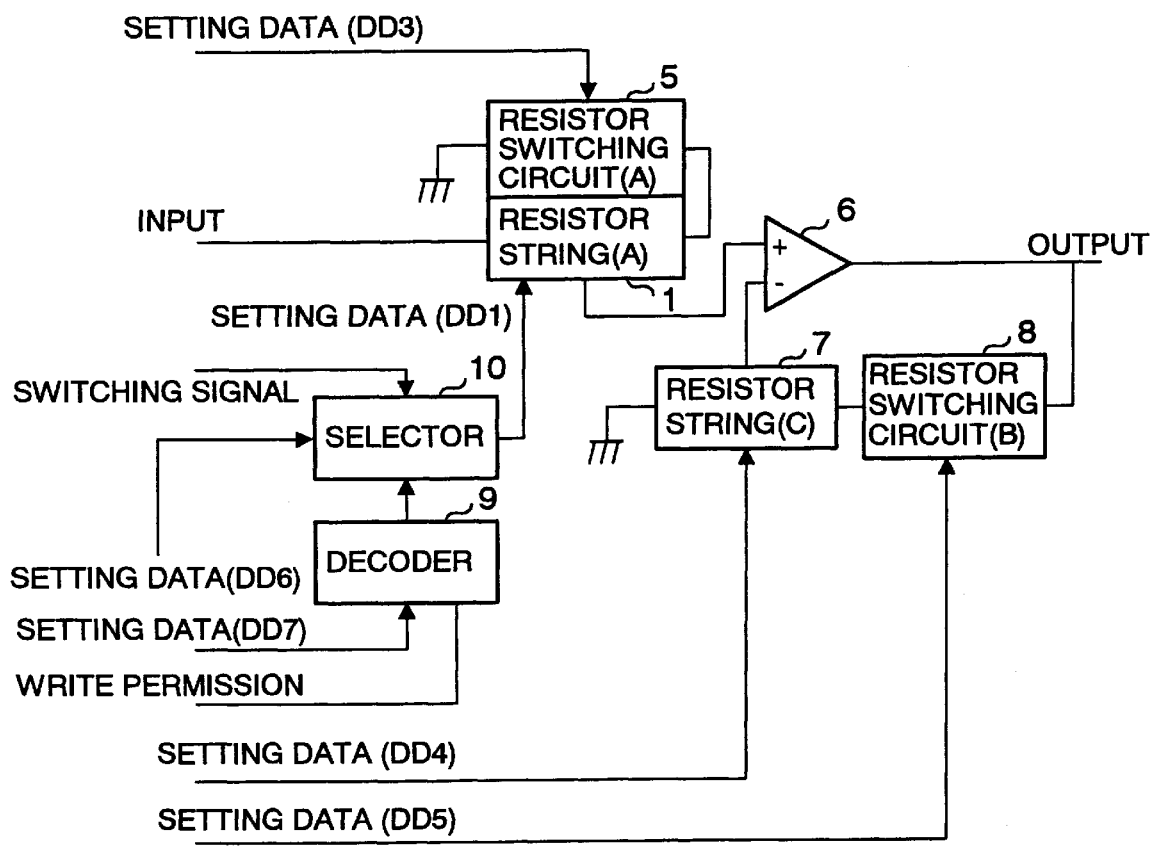
FIG. 22 is a block diagram of a variable gain amplifier according to a fourteenth embodiment of the present invention.

A description will now be given, with reference to FIG. 22, of a fourteenth embodiment of the present invention. FIG. 22 is a block diagram of a variable gain amplifier according to the fourteenth embodiment of the present invention.

As shown in FIG. 22, the variable gain amplifier according to the fourteenth embodiment has the same structure as the variable gain amplifier according to the above-mentioned thirteenth embodiment except for a selector 10 being provided between the decoder 9 and the resister string (A). In this embodiment, one of the setting data 6 and data generated by the decoder 9 according to the setting data DD6 is selected so as to be supplied to the resistor string (A) as the setting data DD1. The selection is performed by the selector 10. Accordingly, a gain curve can be switched to the original gain curve in a short time without rewriting the contents of the memory of the decoder 9.

Figure 23:
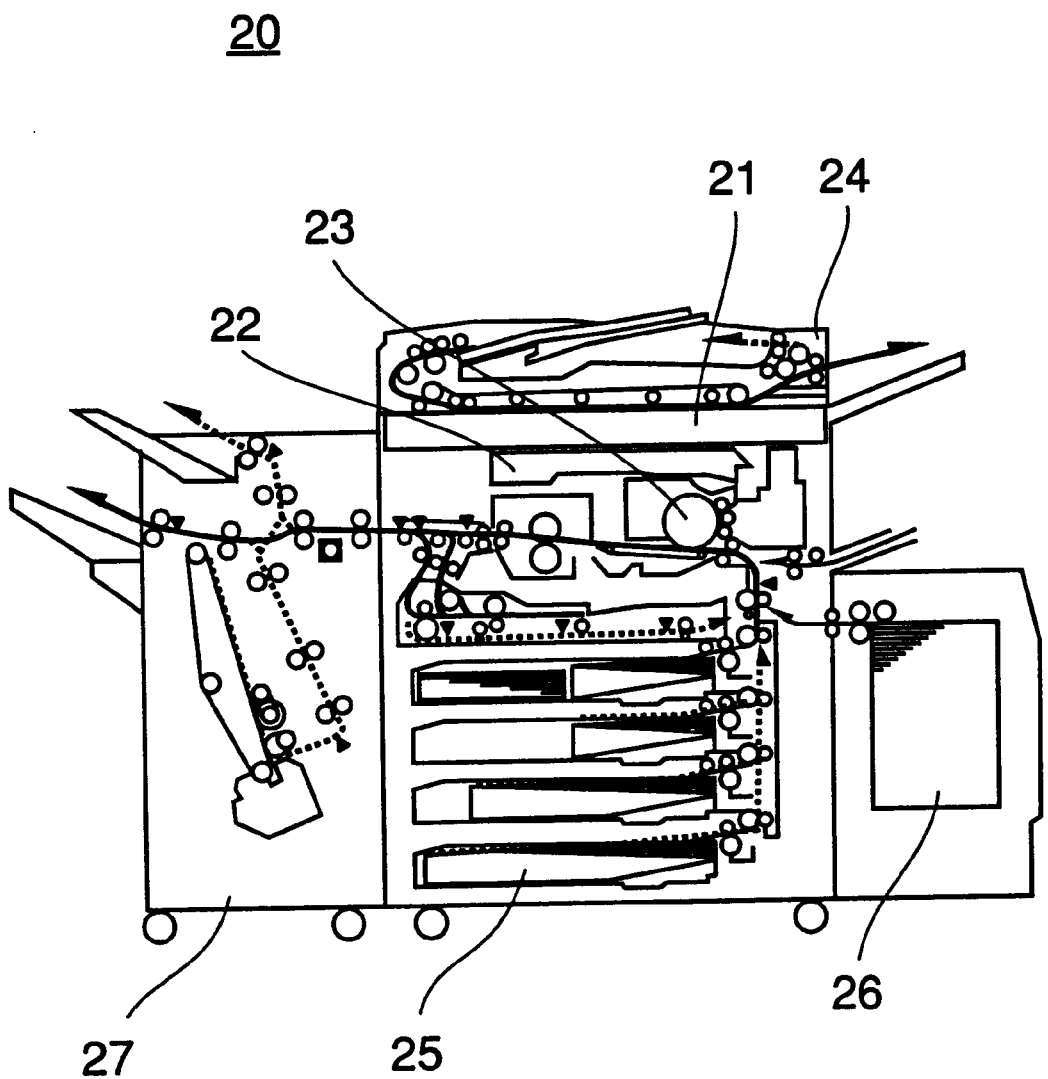
FIG. 23 is an illustration of a copy machine having a scanner provided with the variable gain amplifier according to one of the embodiments of the present invention.

A description will now be given of a copy machine to which the variable gain amplifier according to the present invention is applied. FIG. 23 is an illustration of a copy machine having a scanner provided with the variable gain amplifier according to one of the above-mentioned embodiments of the present invention.

The copy machine 20 shown in FIG. 23 is a general-purpose digital copy machine for office use. The copy machine 20 comprises a scanner unit 21 for reading an original image, a writing unit 22 for writing a latent image onto a photosensitive drum and a processing unit 23 for developing the latent image and transferring the developed image onto a recording paper.

An original document provided to an automatic sheet feeder 24 is fed to the scanner unit 21 and the original image to be copied is read by the scanner unit 21. The scanner unit 21 produces digital image data according to the read data of the original image, and provides the digital image data to the writing unit 22. The writing unit 22 processes the digital image data and produces a latent image on the photosensitive drum of the processing unit 23. Then, the processing unit 23 develops the latent image, and transfers the developed image onto a recording paper supplied from a paper feeding unit 25 or a paper feeding unit 26. The recording paper on which the developed image is transferred is fed to a paper ejecting unit 27 and is ejected outside the copy machine 20.

Figure 24:
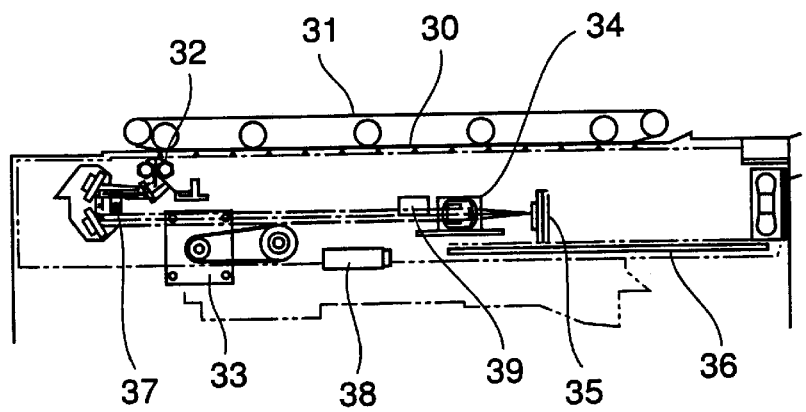
FIG. 24 is an illustration for explaining a scanner shown in FIG. 23.

FIG. 24 is an illustration for explaining the scanner unit 21 shown in FIG. 23. The original document to be copied is placed on a contract glass 30 by being fed by an original-sheet feeding belt 31. An optical reading unit is provided under the contact glass 30 for reading the original image of the original document. The optical reading unit includes a lamp 32 for projecting a light onto the original sheet and various lenses and mirrors that direct a reflected light to a CCD sensor. The optical reading unit travels along the contact glass 30 by being driven by a scan motor 33. The reflected light is incident on an objective lens 34 so that the reflected light is focused on the CCD sensor provided on a sensor board 35. The sensor board 35 converts analog image signal obtained by the CCD sensor into digital image data. The digital image data is provided from the sensor board 35 to a control and processing board 36. The control and processing board 36 includes various circuits for controlling operations of each part such as the scan motor 33 and for processing the digital image data provided form the sensor board 35. The digital image data processed by the control and processing board 36 is provided to the writing unit 22 shown in FIG. 23. Additionally, the scanner unit 21 is provided with various sensors such as an HPS 36 for positioning the optical reading unit or an APS1 and an APS2 for detecting the size of the original document placed on the contact glass 30.

Figure 25:
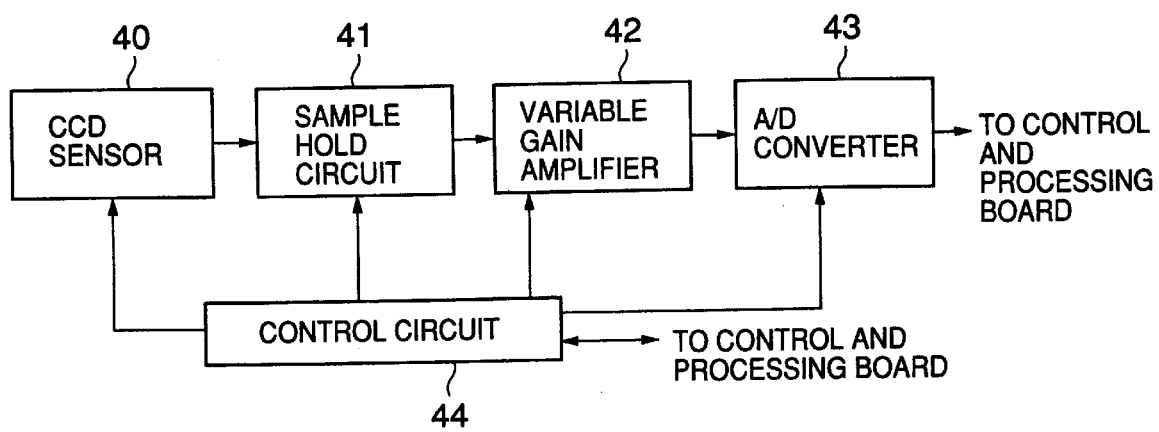
FIG. 25 is a block diagram of a sensor board provided in the scanner shown in FIG. 24.

FIG. 25 is a block diagram of the sensor board 35 provided in the scanner unit 21. The sensor board 35 includes the CCD sensor 40, a sample hold circuit 41, a variable gain amplifier 42, an A/D converter 43 and a control circuit 44. It should be noted that the variable gain amplifier according to one of the above-mentioned embodiments of the present invention is used as the variable gain amplifier 42 provided in the sensor board 35.

The control circuit 44 communicates with the control and processing board 36 so as to generate various control signals and timing signals. As mentioned above, the CCD sensor 40 outputs an analog voltage signal in synchronization with a drive signal provided by the control circuit. The sample hold circuit 41 samples and holds the analog voltage signal in accordance with the timing signal provided by the control circuit 44. The sampled analog voltage signal is supplied to the variable gain amplifier 42. The variable gain amplifier 42 amplifies the analog voltage signal in accordance with a gain set by the control circuit. An output of the variable gain amplifier 42 is converted into digital data in accordance with the timing signal provided by the control circuit 44.

It should be noted that the above-mentioned scanner unit 21 may be provided with an interface with an external apparatus such as a computer so that the scanner unit 21 can be used as a stand-alone scanner as a peripheral unit of an image forming system.

The present invention is not limited to the specifically disclosed embodiments, and variations and modifications may be made without departing from the scope of the present invention.

The present application is based on Japanese priority application No.10-56484 filed on Mar. 9, 1998, the entire contents of which are hereby incorporated by reference.

What is claimed is:

1. A variable gain amplifier comprising:
   an amplifier; and
   a digital-setting-type signal attenuator comprising:
      a resistor string including a plurality of resistors connected in series;
      a maximum attenuation-factor limiting resistor connected between said resistor string and a ground;
      a plurality of analog switches each of which is connected to respective points of said resistor string; and
      a decoder generating a control signal for selecting at least one of said analog switches, said control signal being generated based on setting data provided from an external device,
   wherein a voltage across said resistor string is divided by said plurality of resistors included in said resistor string, and the divided voltage is output to said amplifier from at least one of the analog switches selected by the control signal generated by said decoder.

2. The variable gain amplifier as claimed in claim 1, wherein said decoder generates the control signal for selecting two adjacent ones of said analog switches so that a middle voltage between voltages output from the two selected analog switches is output from said digital-setting-type signal attenuator to said amplifier.

3. The variable gain amplifier as claimed in claim 1, wherein said resistor string includes a compensation capacitance provided between an arbitrary point of said resistor string and an input point of said resistor string.

4. The variable gain amplifier as claimed in claim 1, wherein said analog switches includes a plurality of first stage analog switches connected to said resistor string and a plurality of second stage analog switches, said first stage analog switches being divided into a plurality of groups so that the first stage analog switches included in each of the groups are connected to the respective one of said second stage analog switches.

5. The variable gain amplifier as claimed in claim 4, wherein said analog switches further including a plurality of n-th stage analog switches where n is an integer greater than 3 so that (n−1)th stage analog switches are divided into a plurality of groups and each of the (n−1)th stage analog switches included in each of the groups are connected to the respective one of said n-th stage analog switches.

6. The variable gain amplifier as claimed in claim 1, wherein said maximum attenuation-factor limiting resistor comprises a resistor switching circuit including a plurality of resistors so that one of said resistors of said resistor switching circuit is connected to said resistor string.

7. The variable gain amplifier as claimed in claim 1, further comprising a second digital-setting-type signal attenuator having an output connected to an output of said amplifier, said second digital-setting type signal attenuator having substantially the same structure as that of said digital-setting-type signal attenuator,
   wherein said amplifier comprises an operational amplifier having a normal input terminal and a reverse input terminal so that an output of said resistor string being input to said normal input terminal and an output of said second resistor string is input to said reverse input terminal.

8. The variable gain amplifier as claimed in claim 7, further comprising a second resistor switching circuit provided between the output of said operational amplifier and the output of said second digital-setting-type signal attenuator, said second resistor switching circuit having substantially the same structure as said resistor switching circuit.

9. The variable gain amplifier as claimed in claim 1, further comprising a second decoder for decoding setting data provided from an external device so as to generate the setting data provided to said digital-setting-type signal attenuator.

10. The variable gain amplifier as claimed in claim 9, further comprising a selector selecting one of the setting data to be provided to said second decoder and the setting data to be provided to said digital-setting-type signal attenuator so that the selected setting data is provided to said digital-setting-type signal attenuator.

11. An image scanner comprising:
   an image sensor outputting an analog image signal corresponding to an image scanned by said scanner; and
   a variable gain amplifier amplifying the analog image signal output from said image sensor,
   wherein said variable gain amplifier comprises an amplifier and a digital-setting-type signal attenuator, said digital-setting-type signal attenuator comprising:
      a resistor string including a plurality of resistors connected in series;
      a maximum attenuation-factor limiting resistor connected between said resistor string and a ground;
      a plurality of analog switches each of which is connected to respective points of said resistor string; and a decoder generating a control signal for selecting at least one of said analog switches, said control signal being generated based on setting data provided from an external device, wherein a voltage across said resistor string is divided by said resistors included in said resistor string, and the divided voltage is output to said amplifier from at least one of the analog switches selected by the control signal generated by said decoder.

12. A copy machine comprising:

an image scanner scanning an original image and outputting image data corresponding to the original image; and an image processing mechanism producing an image in accordance with the image data output from said image scanner, wherein said image scanner comprises:
- an image sensor outputting an analog image signal corresponding to an image scanned by said scanner; and
- a variable gain amplifier amplifying the analog image signal output from said image sensor, wherein said variable gain amplifier comprises an amplifier and a digital-setting-type signal attenuator, said digital-setting-type signal attenuator comprising:
- a resistor string including a plurality of resistors connected in series;
- a maximum attenuation-factor limiting resistor connected between said resistor string and a ground;
- a plurality of analog switches each of which is connected to respective points of said resistor string; and
- a decoder generating a control signal for selecting at least one of said analog switches, said control signal being generated based on setting data provided from an external device, wherein a voltage across said resistor string is divided by said resistors included in said resistor string, and the divided voltage is output to said amplifier from at least one of the analog switches selected by the control signal generated by said decoder.

* * * * *